(12) United States Patent
Bonora et al.

(10) Patent No.: US 10,593,583 B2
(45) Date of Patent: *Mar. 17, 2020

(54) INTEGRATED SYSTEMS FOR INTERFACING WITH SUBSTRATE CONTAINER STORAGE SYSTEMS

(71) Applicant: Brooks Automation, Inc., Chelmsford, MA (US)

(72) Inventors: Anthony C. Bonora, Portola Valley, CA (US); Richard H. Gould, Fremont, CA (US); Michael Krolak, Fremont, CA (US)

(73) Assignee: Brooks Automation, Inc., Chelmsford, MA (US)

( * ) Notice: Subject to any disclaimer, the term of this patent is extended or adjusted under 35 U.S.C. 154(b) by 177 days.

This patent is subject to a terminal disclaimer.

(21) Appl. No.: 15/816,728

(22) Filed: Nov. 17, 2017

(65) Prior Publication Data

US 2018/0096873 A1 Apr. 5, 2018

Related U.S. Application Data

(63) Continuation of application No. 14/537,696, filed on Nov. 10, 2014, now Pat. No. 9,842,756, which is a
(Continued)

(51) Int. Cl.
*B65G 1/04* (2006.01)
*H01L 21/677* (2006.01)

(52) U.S. Cl.
CPC .. *H01L 21/67766* (2013.01); *H01L 21/67733* (2013.01); *H01L 21/67736* (2013.01);
(Continued)

(58) Field of Classification Search
CPC .. B65G 1/133; B65G 1/0435; H01L 21/67769
(Continued)

(56) References Cited

U.S. PATENT DOCUMENTS 5,839,872 A * 11/1998 Goto ............... B66F 9/141
414/280
6,604,624 B2 * 8/2003 Hirata ............ H01L 21/67706
198/494

(Continued)

FOREIGN PATENT DOCUMENTS

| JP | H02261158 | 10/1990 | ............ E04F 19/08 |
| JP | H02261158 A | 10/1990 | |
| JP | H10250836 A | 9/1998 | |
| JP | 2008160076 A | 7/2008 | |

*Primary Examiner* — Jonathan Snelting
(74) *Attorney, Agent, or Firm* — Penilla IP, APC

(57) ABSTRACT

A storage system and methods for operating a storage system are disclosed. The storage system includes a plurality of storage shelves, and each of storage shelves has a shelf plate for supporting a container. Each of the storage shelves is coupled to a chain to enable horizontal movement and each is further coupled to a rail to enable guiding to one or more positions. A motor is coupled to a drive sprocket for moving the chain. The rail has some sections that are linear and some sections that are nonlinear. The sections are arranged in a loop. Example configurations of the storage system include one or more of stationary shelves, extended horizontal tracks for a hoist, a conveyor at a level of the storage system, and a manual loading station. The hoist, with an extended horizontal track interfaces with the manual loading station.

25 Claims, 28 Drawing Sheets

Related U.S. Application Data continuation of application No. 12/780,846, filed on May 14, 2010, now Pat. No. 8,882,433, which is a continuation-in-part of application No. 12/780,761, filed on May 14, 2010, now Pat. No. 8,851,820.

(60) Provisional application No. 61/216,570, filed on May 18, 2009, provisional application No. 61/332,802, filed on May 9, 2010.

(52) U.S. Cl.
CPC .. H01L 21/67769 (2013.01); H01L 21/67775 (2013.01); *B65G 2201/0297* (2013.01); *Y10S 414/14* (2013.01)

(58) Field of Classification Search
USPC ................. 414/331.02, 331.03, 331.05, 940
See application file for complete search history.

(56) References Cited

U.S. PATENT DOCUMENTS

| | | | |
|---|---|---|---|
| 7,604,449 B1 | 10/2009 | Kaveh | 414/411 |
| 8,123,456 B2 | 2/2012 | Wakabayashi | |
| 8,851,820 B2 | 10/2014 | Bonora et al. | 414/217.1 |
| 8,882,433 B2* | 11/2014 | Bonora | H01L 21/67766 |
| | | | 414/331.03 |
| 9,842,756 B2* | 12/2017 | Bonora | H01L 21/67766 |
| 2006/0120833 A1 | 6/2006 | Bonora et al. | 414/217 |
| 2008/0112784 A1 | 5/2008 | Rogers et al. | 414/411 |
| 2009/0003977 A1* | 1/2009 | Aburatani | H01L 21/67109 |
| | | | 414/217 |
| 2009/0060697 A1 | 3/2009 | Wakabayashi | |
| 2010/0143082 A1 | 6/2010 | Wang et al. | 414/222.02 |
| 2010/0290872 A1 | 11/2010 | Bonora et al. | 414/225.01 |

\* cited by examiner

INTEGRATED SYSTEMS FOR INTERFACING WITH SUBSTRATE CONTAINER STORAGE SYSTEMS

CLAIM OF PRIORITY

This application is a continuation, under 35 USC § 120, of application Ser. No. 14/537,696, filed on Nov. 10, 2014, and titled "Integrated Systems for Interfacing with Substrate Container Storage Systems", which is a continuation, under 35 USC § 120, of application Ser. No. 12/780,846, filed on May 14, 2010, and titled "Integrated Systems for Interfacing with Substrate Container Storage Systems", now issued as U.S. Pat. No. 8,882,433, which is a continuation-in-part, under 35 USC § 120, of U.S. patent application Ser. No. 12/780,761, filed on May 14, 2010, now U.S. Pat. No. 8,851,820, and titled "Substrate Container Storage System", which claims priority, under 35 USC § 119(e), to U.S. Provisional Application No. 61/216,570, filed on May 18, 2009, and titled "Horizontal Recirculating Storage System for Substrate Containers", all of which are incorporated by reference herein in their entirety.

The application Ser. No. 12/780,846 claims priority, under 35 USC § 119(e), to U.S. Provisional Application No. 61/216,570, filed on May 18, 2009, and titled "Horizontal Recirculating Storage System for Substrate Containers", and to U.S. Provisional Application No. 61/332,802, filed on May 9, 2010, and titled "Improvements to a Horizontal Recirculating Storage System for Substrate Containers", all of which are incorporated by reference herein in their entirety.

BACKGROUND

There are several ways that semiconductor wafer containers are stored in a semiconductor fabrication facility ("fab"). Large centralized stockers can store the containers of wafers until they are needed for processing, receiving the containers from a transport system known as an Automated Material Handling System ("AMHS") at an input port. In general, an AMHS is any computer controlled system in a factory that moves work pieces between work stations, and between work stations and storage locations. In a fab, an AMHS will move containers of wafers and empty containers between process equipment, metrology equipment and stockers. When processing is required for the wafers, they are retrieved in their container from their storage shelf by a robotic mechanism ("stacker robot"), delivered to an output port on the stocker, picked up by the AMHS, and delivered to the desired processing station. The stacker robot typically requires a large space between the walls of stationary storage shelves. The space is needed to allow for operating clearance and motion of the stacker robot and its container payload. There may also be one or more ports where human operators can manually deliver and retrieve containers from the stocker.

To better distribute the storage of containers, smaller stockers may be located in processing bays of the fab where the containers can be stored closer to their next processing station, reducing delivery time and travel distance for the containers when they are requested for the next processing operation. Also, distributing the smaller stockers reduces the problem of AMHS traffic congestion at the large stockers and the throughput limitations of the single stacker robot at the large stocker, however the distribution and use of smaller stockers has its limitations. A smaller stocker still has the elements of a large stocker, including the stacker robot and its operating clearance space, controls, and input/output ports. This duplication makes the small, distributed stockers more costly than the large stockers for the same overall number of storage locations. Some fabs are structured with parallel aisles ("bays") of semiconductor processing, measuring or handling equipment ("tools"). If multiple small stockers were placed in each bay adjacent to the tools there would also be an increase in the floor space used for the fab's storage requirements due to the decreased storage density of a small stocker and access clearance required around the stocker and tool. Floor space is very valuable in a fab because it is used for processing tools that manufacture products, therefore it is desirable to minimize the use of floor space for storage functions.

Therefore, there is a need for container storage systems that are simple and inexpensive, using minimal floor space, while providing high density container storage close to processing. tools.

SUMMARY OF THE INVENTION

One aspect of the present invention is a compact and simple system for storing containers in a horizontal plane. The containers are stored on storage shelves that can be circulated on a loop.

Another aspect of the present invention is to provide a storage system that does not use floor space. The system can be installed above floor mounted facilities and tools. In some cases, parts or sections of a tool may be above the storage system, however, the storage system will still be above the primary functional part of the tool. For instance, if the tool is one or more load ports, the storage system will still be located "above" the tool, even if some component of the tool is above the storage system. And, the term "above" should be understood to generically be a height that is greater than a height of the tool, e.g., the functional part of the tool. In this manner, the storage system can either be directly over (e.g., aligned) or not directly over the tool (e.g., not aligned), so long as the storage system is at the height that is greater than the tool. As used herein, a height can be measured relative to reference surface. The "reference surface" is, in one embodiment, a floor of a room, such as a clean room, factory or laboratory.

Another aspect of the present invention is to provide a storage system that does not interfere with access to floor mounted facilities and tools. The system can be installed between tools but at an elevation above the tools that allows for the unhindered access to the sides of the tools for maintenance and operation.

Another aspect of the present invention is to provide a storage system that has a greater container storage density than conventional stockers due to the elimination of the large clearance space required for a stacker robot.

Another aspect of the present invention is to provide a storage system that can interface with the AMHS of a fab.

Another aspect of the present invention is to provide a storage system with fast access to stored containers.

Another aspect of the present invention is to provide a storage system with active ports that can reduce delays in accessing the stored containers and provide a flexible interface to an AMHS.

Another aspect of the present invention is to provide a storage system with active ports that provides clear access via OHT to a loadport below when the active port is retracted.

Another aspect of the present invention is to provide a storage system with multiple levels of storage shelves. Each level of the storage system circulates storage shelves on a loop and has one or more active ports.

Yet another aspect of the present invention is to provide a storage system that can be mounted above a tool to provide local storage of containers used by the tool.

Still another aspect of the present invention is to provide a storage system that uses active ports and a hoist, or other mechanism, to transfer containers between the storage system and the tool without the aid of an AMHS.

Yet another aspect of the present invention is to provide a storage system that uses active ports and a hoist, or other mechanism, to transfer containers between the storage system and the tool while still allowing the AMHS to deliver and retrieve containers to/from the tool.

In one embodiment, a storage system and methods for operating a storage system are disclosed. The storage system includes a storage system assembly positioned at a height that is greater than a height of a tool used for loading and unloading substrates to be processed. The storage system locally stores one or more containers of substrates. The storage system assembly includes a plurality of storage shelves, and each of the plurality of storage shelves has a shelf plate with shelf features for supporting a container. Each of the plurality of storage shelves is coupled to a chain to enable horizontal movement and each is further coupled to a rail to enable guiding to one or more positions. A motor is coupled to a drive sprocket for moving the chain, such that each of the plurality of storage shelves moves together along the rail to the one or more positions. The rail has at least some sections that are linear and some sections that are nonlinear and the sections are arranged in a loop.

Example configurations of the storage system can include one or more of stationary shelves, extended horizontal tracks for hoists, conveyors at the level of the storage system assembly, and a manual loading station. The hoist, with an extended horizontal track can therefore interface with the manual loading station.

DETAILED DESCRIPTION

The descriptions of the embodiments of this invention describe the use of a Front Opening Unified Pod ("FOUP") for the storage of semiconductor wafers in a fab, however, the present invention is not limited to FOUPs and/or semiconductor manufacturing. For purposes of describing this invention, other examples include wafer containers (with walls and without), Substrate containers (with walls and without), cassettes, flat panel display cassettes, Standard Mechanical Interface ("SMIF") pods, reticle pods, or any structure for supporting a substrate, whether the structure supports a single substrate or multiple substrates, or whether the structure is in an enclosing container or the structure is open to the external environment.

Figure 1:
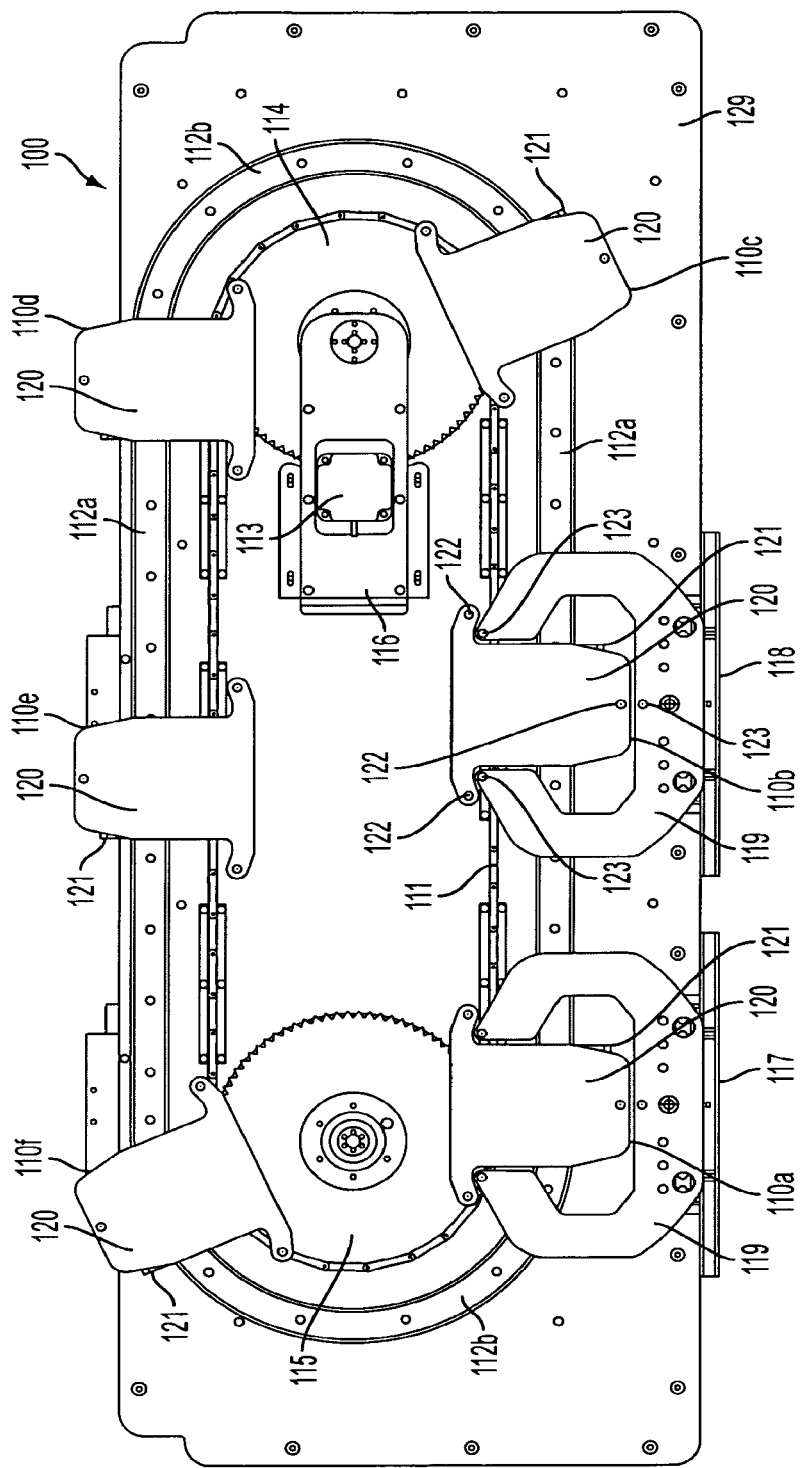
FIG. 1 is a plan view of the present invention including active ports.

One embodiment of the present invention is shown in FIG. 1. Storage system 100 has 6 movable storage shelves 110a-110f. Each storage shelf is connected to drive chain 111 through a vertical pin that is attached to a link of the chain. The pin mates with a slot in the underside of the storage shelf assembly, however, the slot, which is oriented perpendicular to the direction of chain motion, is large enough to allow the pin to rotate and slide without binding. The horizontal motion of the storage shelves is guided by rail 112 which is engaged with a bearing truck under the shelf assembly. Rail 112 has straight sections 112a and curved sections 112b. As the chain 111 moves it pulls the storage shelf by engagement of the pin in the slot, while the rail and bearing truck keep the shelf on a constrained path around the oval configuration of rail sections. It should also be understood that the configuration of the track need not be "oval", and many configurations are possible. In one embodiment, any configuration that defines a loop is envisioned and the loop can have some sections that are linear and some sections that are non-linear. Accordingly, the oval configuration example is just that, an example.

There are other methods of engaging the storage shelf with the chain. For example, a sheet metal bracket with a hole or slot could be fastened to the chain. The hole or slot on the bracket would engage a fixed pin or other feature on the storage shelf. Any other type of engagement hardware would be acceptable if it provided adequate flexibility between the drive chain and the storage shelf while still being able to pull the storage shelf with the drive chain.

While this embodiment uses sprockets and a drive chain for the drive means, other drive components are commercially available and they could be used alternatively. These alternate drives include, but are not limited to; timing belts and pulleys, plastic chain and sprockets, or steel belts and pulleys. The pulleys can be plastic disks, and the belts can be plastic, rubber, smooth, ribbed, pebbled, continuous, segmented, etc. In still other embodiments, the belts and pulleys can be configured below the base plate 129 or in its separate compartment to reduce dust.

The storage system in FIG. 1 moves storage shelves in a loop. A loop is a continuous guidance path for a storage shelf that will repeat if moved in any direction. For example, if storage shelf 110*a* started in the position shown in FIG. 1 and drive sprocket was rotated in the counter-clockwise direction, storage shelf 110*a* would pass through the positions shown for shelves 110*b* through 110*f* until it returned to its original starting position, as shown in the figure. All of the shelves would be moving simultaneously in the same direction in this case, and all must move at the same time. One shelf can not move without having all shelves move in the loop. The loop shown in FIG. 1 approximates an oval, however, a loop can have any shape and it is possible to have a loop that moves in both directions.

Motor 113 turns drive sprocket 114 through a timing belt (not shown) that allows the motor to be mounted to the side of the sprocket. Alternatively, the motor could have a gearhead and be coupled directly to the center of the sprocket. Other methods to couple the motor to the sprocket are known in the art and could alternatively be used. The motor in this embodiment is a step motor that moves to its desired position without the feedback of a position measuring device such as an optical encoder, however, other types of motors could be used, such as a brushless DC servo motor with a rotary encoder. The step motor moves to its desired position by a pre-determined number of small increments in its electrical phases. In this way the step motor can accurately move to its position without a feedback device to measure the position. A brushless DC servo motor uses a feedback device such as an optical rotary encoder to control the trajectory of motion, and to stop at the desired position.

Drive chain 111 wraps around both drive sprocket 114 and idler sprocket 115. Base plate 129 provides a support structure for mounting the system components. Drive sprocket 114 and idler sprocket 115 have bearing assemblies at their centers that connect them to the base plate yet allow them to freely rotate. Motor 113 is connected to the base plate with motor mount 116.

Base plate 129 is shown as a continuous solid plate but represents any planar structure that can support the system components. For example, the base plate could be made from multiple plates, or folded sheetmetal, or sheetmetal supported by a frame, or a grid structure of frame members. The base plate could have substantial vacant areas to allow vertical airflow in a fab cleanroom.

Motor 113 is electrically connected to control circuits (not shown). The circuits in this embodiment are a step motor amplifier and a microprocessor based controller. The step motor amplifier is connected to the motor wires and provides the drive power to rotate the motor in response to control signals from the microprocessor based controller. The microprocessor based controller executes a sequence of program instructions that control the motion trajectory and position of the motor, and interfaces with external systems such as the fab control system, the tool control system, or a operator interface to determine if and how the storage shelves should be moved.

Other alternative control circuits could be used to control the motor such as a Programmable Logic Controller ("PLC"), a Personal Computer ("PC") with motor amplifier, or custom designed embedded control PC board with microprocessor and integrated motor drive circuit.

Another alternative would have one controller, with its own program sequence, controlling the motor, and another controller, with its own program sequence, interfacing with external systems. These two controllers would coordinate their operation through serial or parallel communication lines. It is possible to have the controls divided amongst any number of separate controllers, however, having one microprocessor based controller running a single program sequence is the simplest way to control the complete storage system.

The control circuit can interface with external systems using different methods. For example, it could communicate with the fab control network using Ethernet following the Semiconductor Equipment and Materials International ("SEMI") E88 standard for stocker interface. Alternatively, it could communicate with the fab or tool control system using Ethernet or an RS232 type of serial communications. It could even communicate with external systems through a set of parallel signal lines. The types of communication used in a fab are various and the present invention could embody different types depending on the control architecture and needs of the fab.

Figure 7:
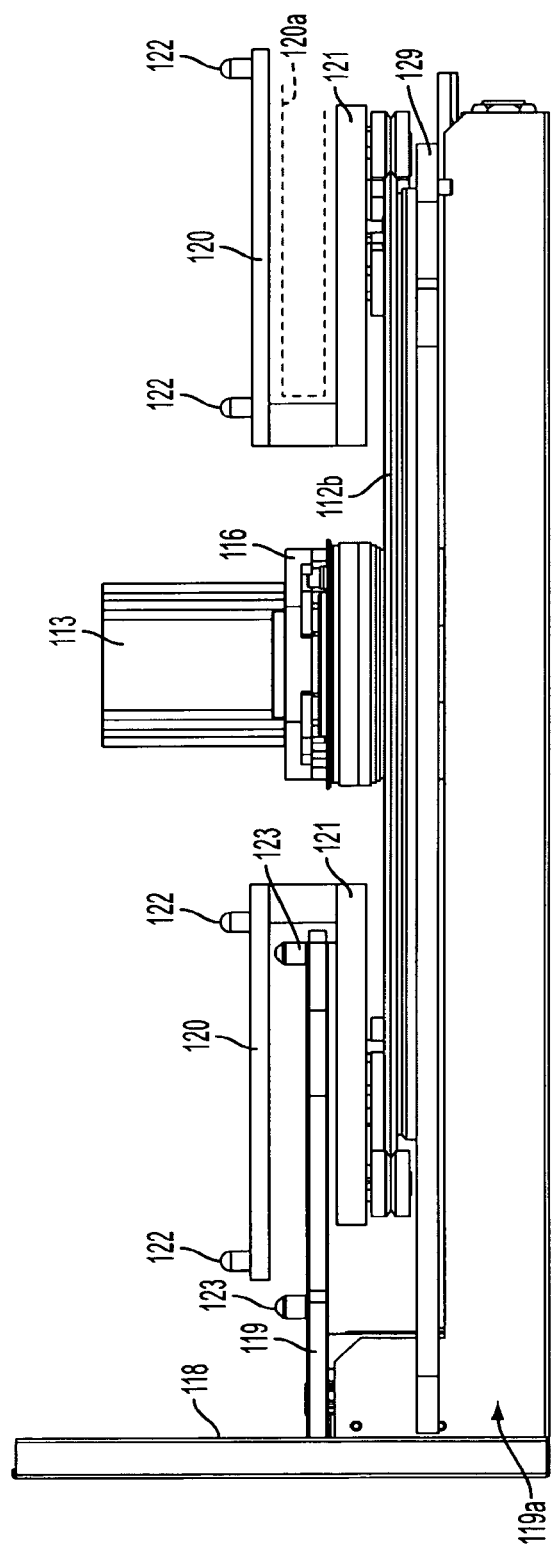
FIG. 7 is a side view of a storage shelf with a retracted active port.

FIG. 1 also shows active ports 117 and 118 in their retracted position. The active ports are mechanisms that can be used to either load a FOUP on to a storage shelf or unload a FOUP from a storage shelf. The active port can move horizontally to either the retracted or extended position. The active port can also move the port plate vertically to either an upper or lower position. In the retracted, lower position, port plate 119 allows motion of the storage shelves 110 because it rests below the shelf plate 120 and above the bearing plate 121. FIG. 7 shows the vertical clearance between the port plate and storage shelf when the port plate is retracted and in the lower position. This vertical clearance is shown by dashed lines, which define a C-shaped space 120*a*. FIG. 1 shows the clearance between the retracted port plate and the storage shelf when the storage shelf is at one of its stop positions. This clearance allows the port plate to move vertically at the stop position to either pick up a FOUP from a storage shelf or place a FOUP on a storage shelf.

Figure 19A:
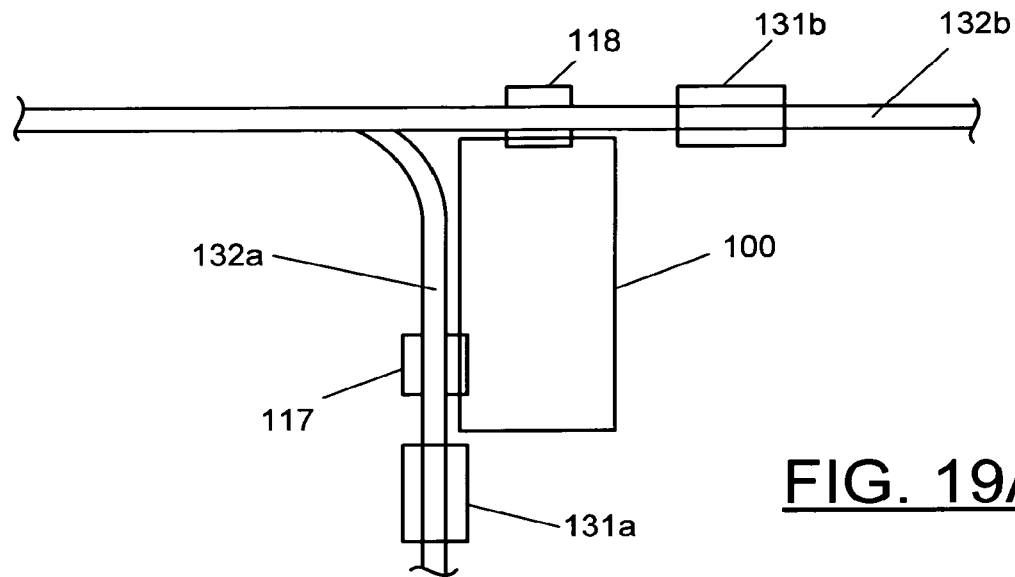
FIGS. 19a and 19b are plan views of the present invention showing different configurations of active ports and OHT.
Figure 19B:
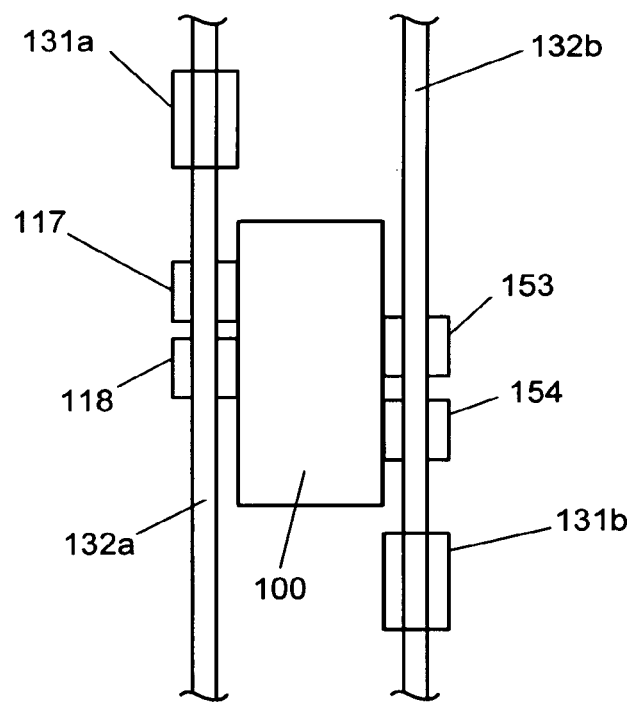

FIG. 1 shows two active ports, however, any number could be used depending on the size of the storage system and the configuration of the AMHS. The active ports can also be located on any side of the storage system. FIGS. 19*a* and 19*b* show plan views of different configurations of active ports and OHT. FIG. 19*a* shows storage system 100 with active ports 117 and 118. Active port 118, at the end of the storage system, is aligned with OHT rail 132*b* which supports OHT vehicle 131*b*, while active port 117, at the side of the storage system, is aligned with OHT rail 132*a*, which supports OHT vehicle 131*a*. FIG. 19*b* shows storage system 100 with active ports 117, 118, 153, and 154. In FIG. 19*b* active ports 117 and 118 are aligned with OHT rail 132*a* and OHT vehicle 131*a*, while active ports 153 and 154 are on the opposite side of the storage system, aligned with OHT rail 132*b* and OHT vehicle 131*b*.

FIGS. 1 and 7 show pins (e.g., features) used to register and retain the position of the FOUP. Shelf pins 122 engage mating features (e.g., a slot) on the bottom of the FOUP to accurately position and support the FOUP while it is resting on the shelf plate. Port pins 123 engage the same mating features (e.g., slot) on the bottom of the FOUP to accurately position and support the FOUP while it is resting on the port plate. The slot allows both pins 122 and 123 to engage the bottom of the container base. However, as shown, the pins 122 and 123, at each of the three locations, are positioned proximate to one another (see FIG. 1, storage shelf 120 and port plate 119 of 110*b*). At a stop position, a FOUP at an active port can have its support transferred from the shelf pins to the port pins by raising the port plate to the upper position.

While FOUPs are designed to have features on their bottom plate for pin engagement, other features can be used to accurately hold a container on a shelf plate or port plate. For example, raised features on the port plate or shelf plate could constrain the outer edge of the bottom of the container or mate with relieved areas on the bottom surface of the container. Thus, it should be understood that other holding features other than pins can be used. The holding features can connect, grab, grasp, couple, mate, balance, or engage the container. Also, the container does not have to be a FOUP, and the container can be any open, closed, partially closed/open, and can also hold any size or type of substrate. The port features and the plate features, as claimed, can encompass any type of holding feature, including pins. If the port features are pins, then they are referred to herein as port pins, and if the plate features are pins, then they are referred to herein as plate pins.

Figure 8:
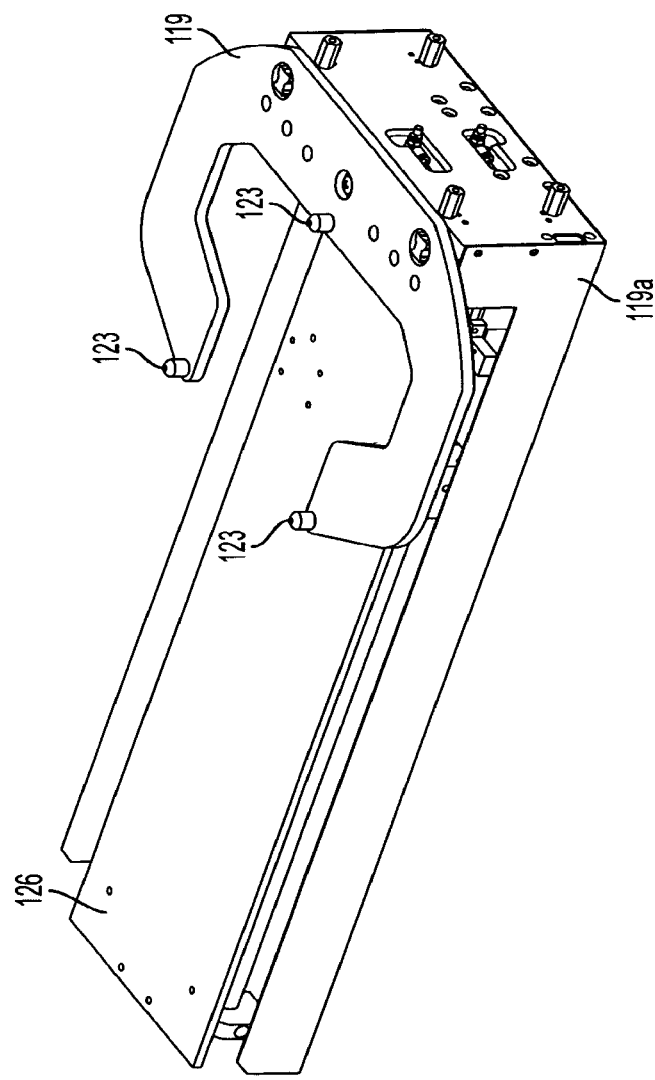
FIGS. 8, 9, 10, and 11 show different positions of the active port mechanism.
Figure 9:
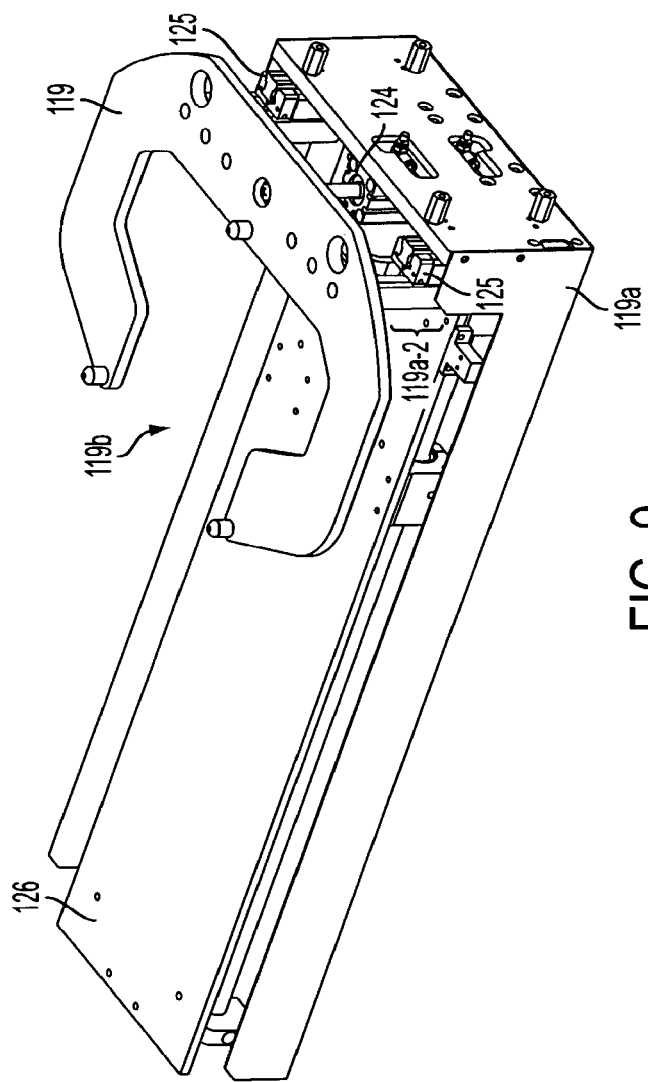
Figure 10:
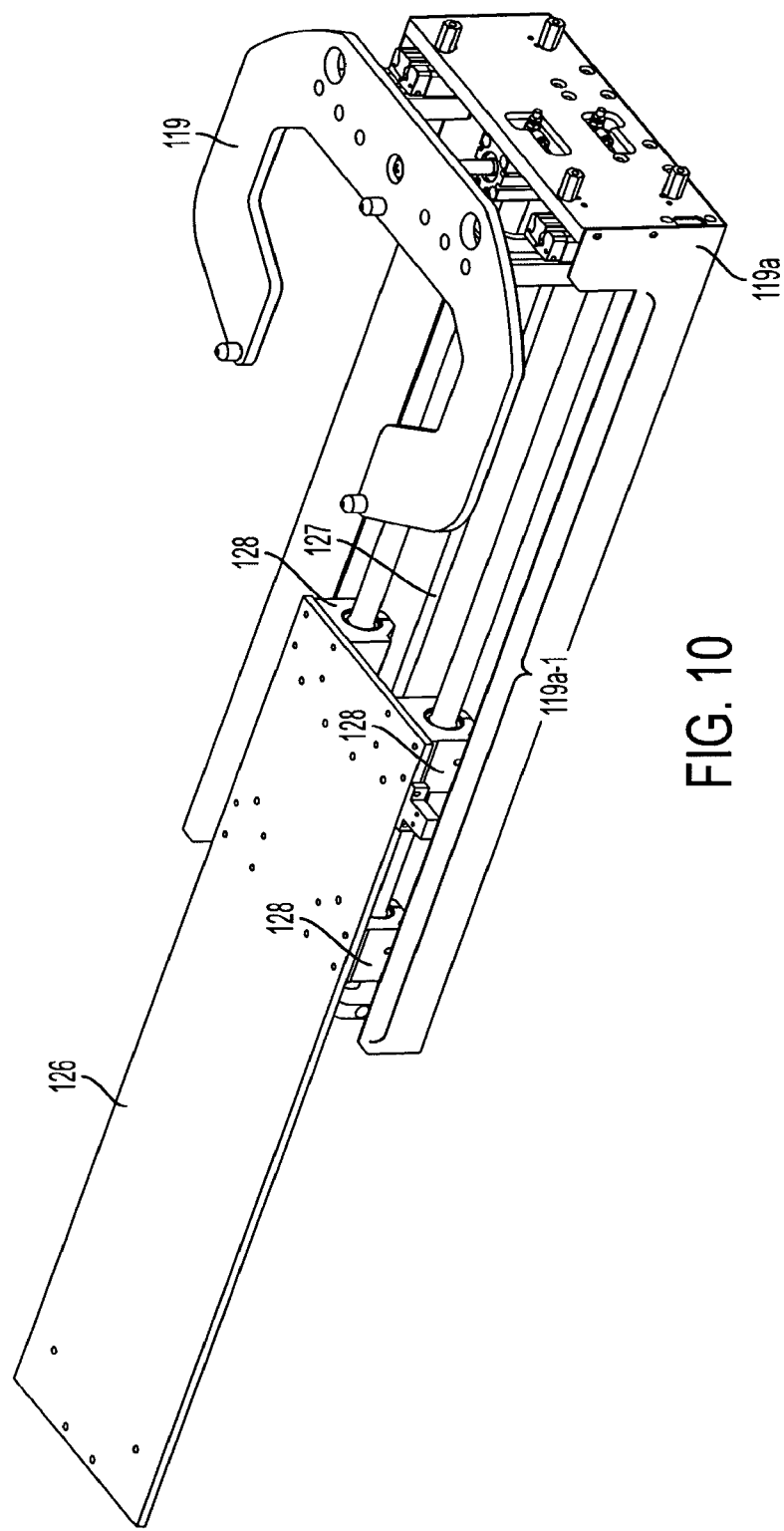
Figure 11:
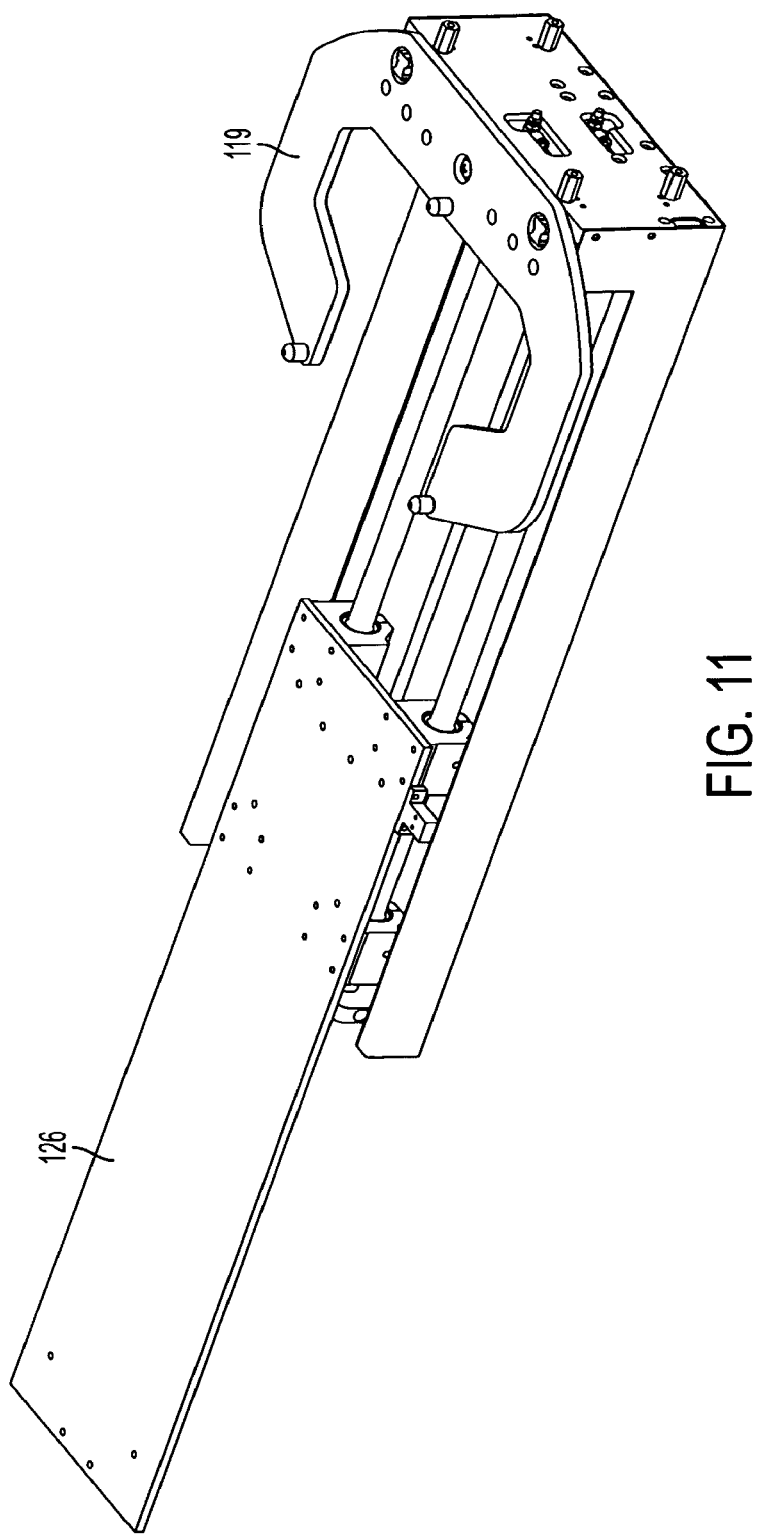

FIGS. 8, 9, 10, and 11 show four positions of the port plate 119 as moved by the active port assembly 119*a*. The active port assembly 119*a* is shown detached from the base plate for clarity. In FIG. 8 the port plate 119 is retracted (retracted position) and at the lower position. In FIG. 9 the port plate 119 has been raised to the upper position by a vertical motion assembly 119*a*-2, as it would be to pick a FOUP off of a storage shelf. The vertical motion can be accomplished in many ways. By way of example, the vertical motion can be by actuation of vertical pneumatic cylinder 124 and is guided by vertical linear bearings 125. When installed in the storage system, active port base 126 is attached to base plate 129. Also shown, the port plate 119 has an opening 119*b*, which is sufficient to fit around the storage shelf. In one embodiment, this opening defines an space on one side, where the port plate pins can still be located at ends of the opening and at an opposite side of the opening. In FIG. 10 the port plate 119, which is in the upper position, has been moved horizontally to the extended position using a horizontal motion assembly 119*a*-1. By way of example, the horizontal motion assembly 119*a*-1 can include actuation of a horizontal pneumatic cylinder 127 and is guided by horizontal linear bearings 128. In FIG. 10 the body of horizontal pneumatic cylinder is under active port base 126 and can not be seen, with only the cylinder's actuator rod visible. In FIG. 11 the port plate 119 has moved to its lower position, where it is now ready to move to the retracted position without concern for collision with moving shelves or FOUPs.

The vertical and horizontal linear motion of the active port are accomplished in this embodiment using pneumatic cylinders, however, other drive means known in the art could alternatively be used, such as a ball screw or a leadscrew driven by an electric motor. Another alternative drive means would be a rack gear driven by an electric motor with a spur gear.

Operation of the active ports 117 and 118 would be coordinated with the operation of motor 113. In this embodiment the active ports are controlled by the same control circuits used to control the operation of motor 113, however, there are many different configurations for the control circuits. One alternative example would be to have the active ports controlled by one or more microprocessor based controllers, and these would communicate through parallel or serial signals with the motor control circuits to coordinate functions.

Figure 4:
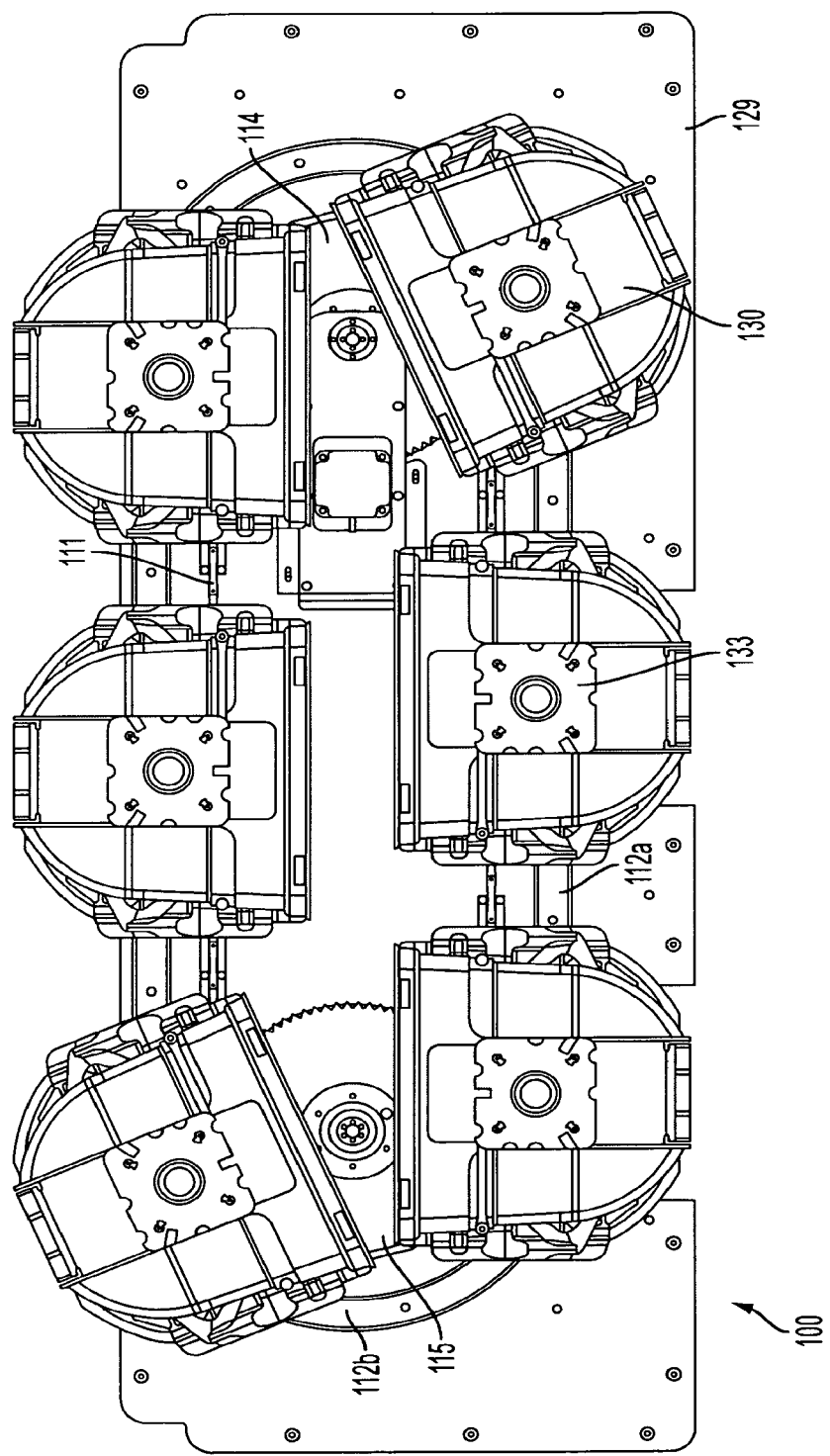
FIG. 4 is a plan view of the present invention without active ports.
Figure 5:
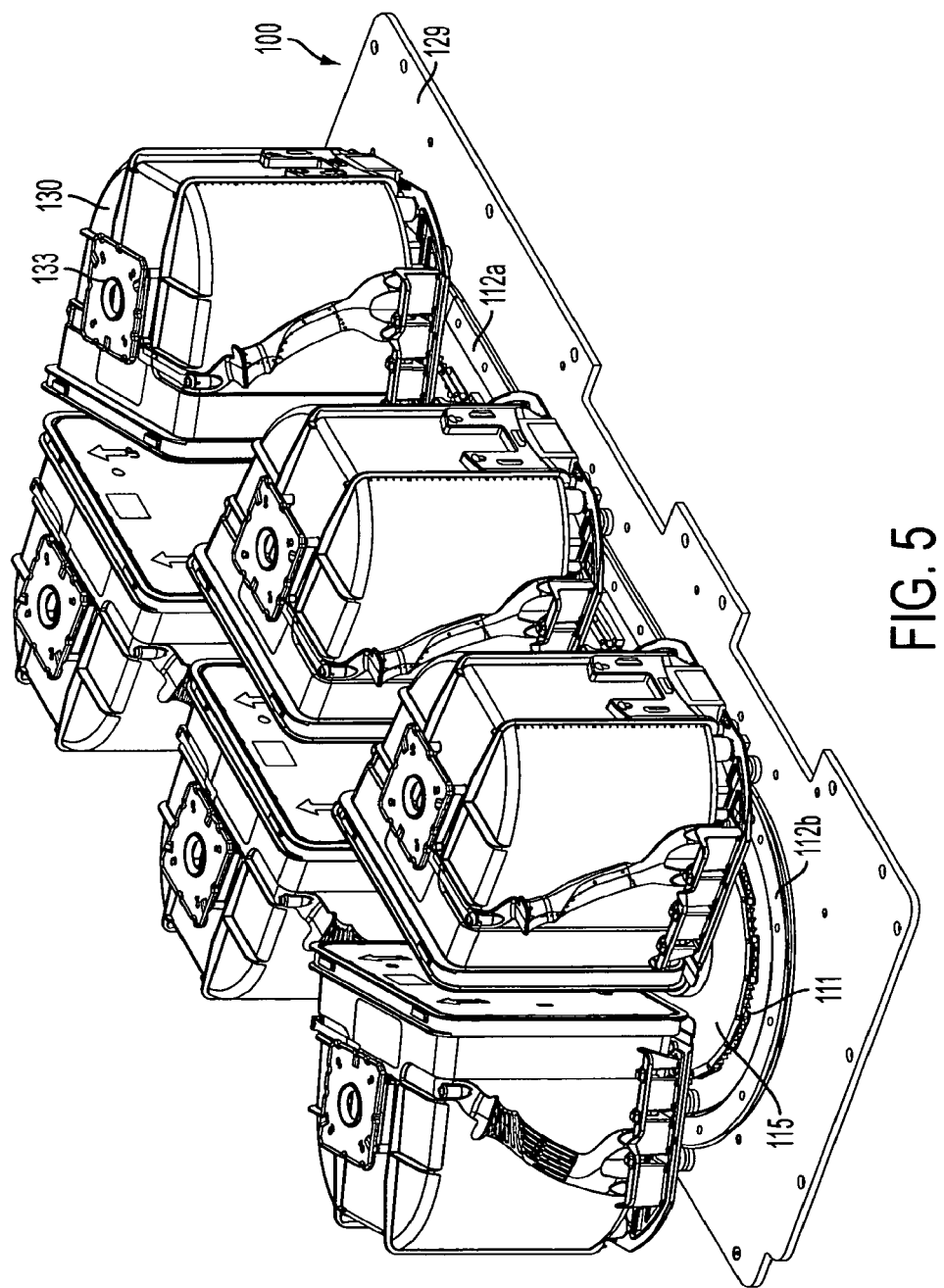
FIG. 5 is another view of the present invention without active ports.

FIGS. 4 and 5 show the storage system with a FOUP 130 loaded on each of the storage shelves. The spacing of the shelves is such that as the shelves and FOUPs are moved around the storage system 100, they do not collide as they turn the corner. Six storage shelves are shown in these figures, however, more or less storage shelves, and FOUPs, could be accommodated by changing the length of the system. The most efficient use of space would be to leave the curved rail sections 112*b* unchanged, and extend the length of the straight rail sections 112*a*, along with the base plate 129 and drive chain 111, however, the length of drive chain for attaching shelves could also be increased by increasing the radius of the curved rail section 112*b* at each end along with the diameter of the sprockets 114 and 115. Either method, or a combination of both, would increase the length of the drive chain, allowing more shelves to be attached at their minimum spacing.

Figure 6:
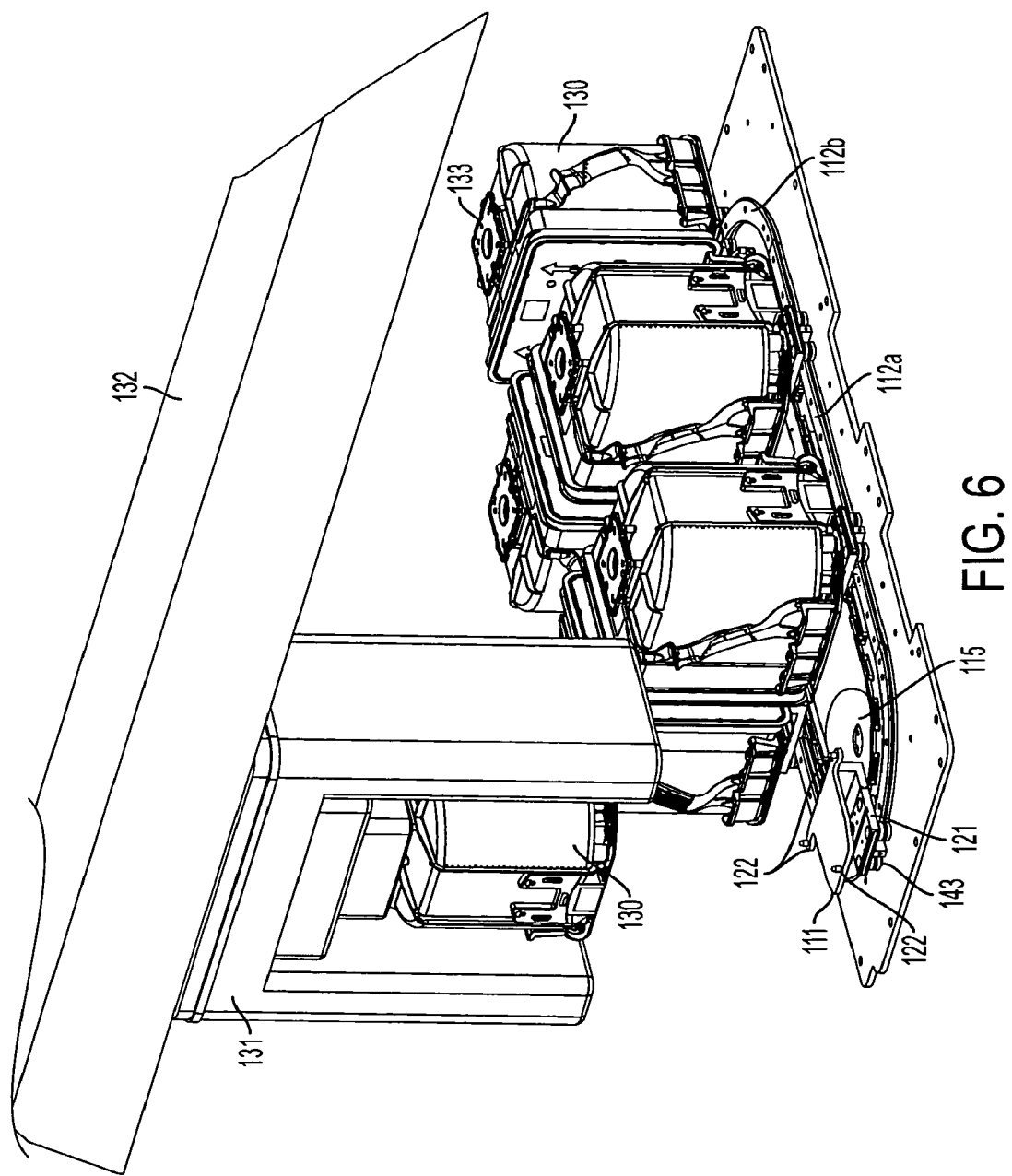
FIG. 6 is a view of the present invention being loaded by an Overhead Transport ("OHT") type of AMHS.

FIG. 6 shows an OHT vehicle 131 with a FOUP 130 aligned over an empty shelf 110*a* of the storage system, which is located at an elevation above the tools in the fab. An OHT vehicle can move a FOUP between stockers, storage systems and tools using the OHT rail 132 to support it. The OHT vehicle grips the FOUP by the FOUP top handle 133 using a gripper mechanism and travels about the fab at an elevation above the tools. The FOUP is lowered or raised at the stockers, storage systems or tools by using a hoist. The other five storage shelves 110*b*-110*f* have FOUPs stored on them, and 110*a* is empty. OHT vehicle 131 moves along OHT rail 132 and stops at a position which is aligned with the stopped shelf 110*a*.

In this position it can lower the FOUP on to shelf 110*a*. After the FOUP is lowered on to shelf 110*a*, it can retract its hoist and move to another destination or it can pick up another FOUP from the storage system. To pick up another FOUP, the OHT would wait until the desired FOUP has been moved to the aligned position under the OHT vehicle, lower its gripper with its hoist, grip the FOUP top handle, raise the FOUP, then proceed to its next destination. The positioning of a new FOUP for pick up is very fast because it only requires the operation of a single motor. The storage system control circuits could drive the motor in either direction to move the FOUP to the aligned position under the OHT, and for minimum delay, it could choose the direction that resulted in the minimum travel distance.

Figure 12:
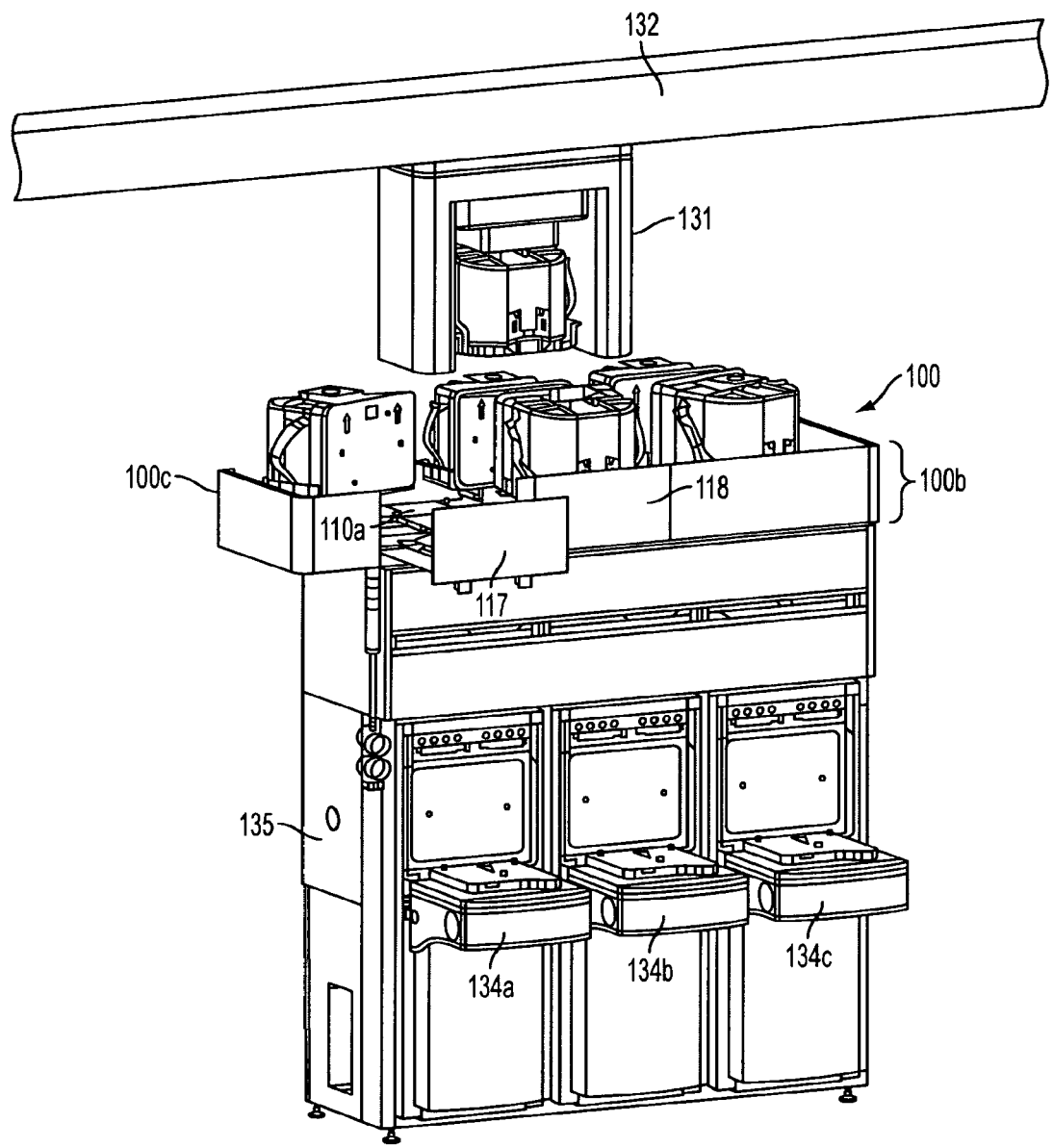
FIG. 12 is a view of the present invention including active ports.
Figure 13:
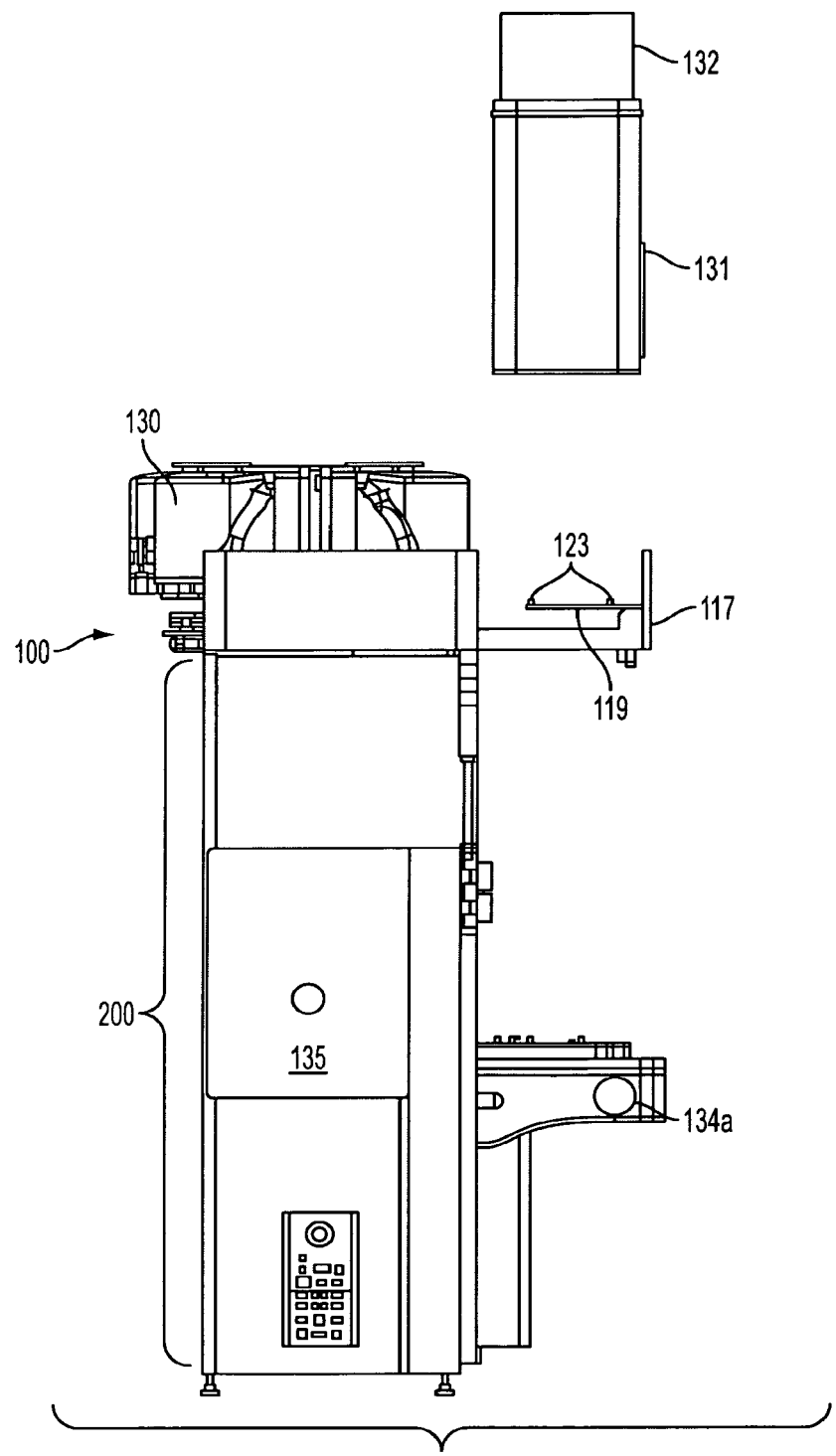
FIG. 13 is a side view of the present invention including active ports.

FIGS. 12 and 13 show the present invention mounted above a tool 135 to provide local storage for the FOUPs that are scheduled to be processed by the tool. The storage system assembly 100*b* of the storage system 100 is shown to include a frame 100*c*. The frame 100*c* may have a structural component and non-structural components, so long as the frame 100*c* can be attached to a surface of an assembly 200 of the tool (see FIG. 13). The assembly 200 can include parts of the tool only or can also include add-on components, panels, electronics, screens, frames, ducts, vents, filters, tracks, pneumatics, circuits, facility connections, frame stabilizers, electrical connectors, communications connectors, and the like. Thus, placing the storage system assembly 100b over the tool can include placing or connecting the storage system assembly 100b to parts of the tool or components connected to the tool. Also shown, in FIG. 13 is that, in one example, the OHT 131 is aligned over the active port plate 119, as well as the tool shelf of tool load ports 134a. The tool shelf can be a drop or pickup point for the OHT and so can the active port plate 119, as they are aligned in a zone (e.g., container load zone) that is configured to receive or supply containers.

OHT vehicle 131 moves along OHT rail 132 until aligned with active port 117, active port 118, or any of the tool loadports 134a, 134b, or 134c. OHT vehicle 131 is in position to load a FOUP on to empty active port 117, which could then retract and lower it on to empty storage shelf 110a, however, other FOUP transfers are possible. For example, with all active ports retracted, the OHT vehicle could transfer its FOUP to one of the loadports 134a, 134b, or 134c.

Another example would have the OHT vehicle arrive at the position of active port 117 while not carrying a FOUP. Active port 117 could pick up a FOUP from a storage shelf and move to the extended position, where it could then be grabbed by the OHT gripper and lifted to the OHT vehicle. After active port 117 retracted, the OHT vehicle could then lower the FOUP to one of the loadports 134a, 134b, or 134c.

The storage system could also be used to store empty FOUPs while the wafers originally from the FOUPs are being processed. This allows a larger batch of wafers to be processed at the same time with a limited number of tool loadports. In this case, with active ports retracted, the OHT would pick up the empty FOUP from one of the loadports, such as loadport 134a, lift the empty FOUP to the OHT vehicle, extend an active port, such as active port 117, then lower the empty FOUP on to the active port, after which the active port could retract and lower the empty FOUP on to an empty shelf that was aligned with the active port.

In FIGS. 12 and 13 the storage system with active ports is installed above a tool, however, it is not necessary for it to be above a tool. An OHT vehicle could access the FOUPs stored in the storage system, using the active ports, if the storage system was located anywhere along the path of the OHT, the only requirement being that the OHT vehicle hoist could be aligned with the active port when it is extended.

Figure 14:
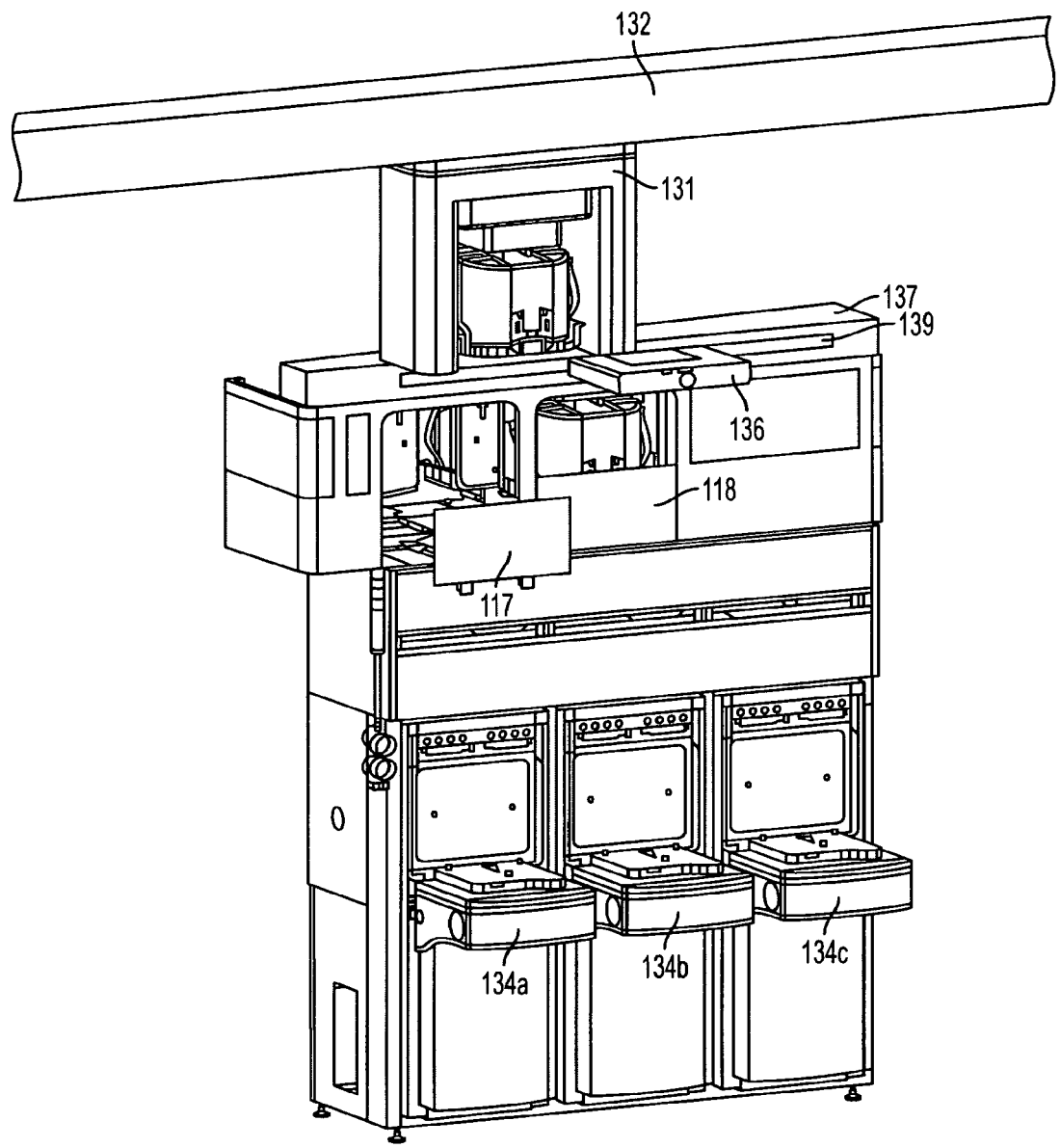
FIG. 14 is a view of the present invention including a transfer hoist and active ports.
Figure 15:
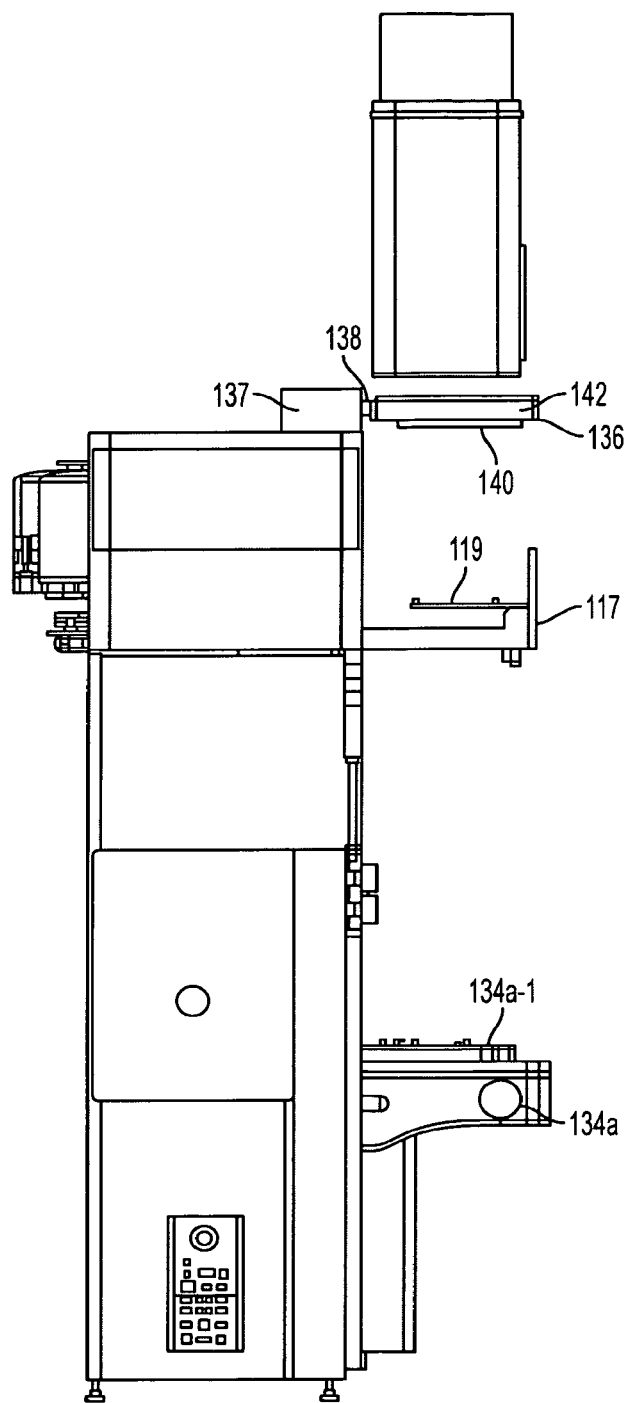
FIG. 15 is a side view of the present invention including a transfer hoist and active ports.

FIGS. 14 and 15 show an embodiment of the present invention where a hoist can transfer FOUPs between the storage system and the tool without the aid of an OHT vehicle. The transfer hoist 136 is shown with transfer hoist gripper 140 retracted into transfer hoist frame 142. The transfer hoist 136 can also align over an active port plate 119 or over one or more of the load port shelves. In this embodiment, the transfer hoist extends into the same zone (e.g., container load zone) that the active port does when extended and the same zone where the shelf of the load port(s) is located. This allows for efficient transfer using the transfer hoist 136. An example of having the transfer hoist 136, active port plate 119, and load port shelf 134a-1 aligned is shown in FIG. 15.

By way of example, transfer hoist 136 can move laterally along hoist linear drive 137. The extent of lateral travel includes positions aligned above active ports 117 and 118, and loadports 134a, 134b, and 134c. The linear drive means 139 in the hoist linear drive 137 could be any of the methods known in the art. For example, the linear drive means could be a rack gear and electric motor with spur gear, or a horizontal ball screw and ball nut driven by an electric motor. The cantilever support 138 would be guided by one or more linear bearings and connected to the movable part of the linear drive means 139. The linear bearings and cantilever support must be rigid enough to keep the transfer hoist 136 in a reasonably horizontal plane with the added load of a full FOUP. A flexible cable assembly in the hoist linear drive would allow power and communication wiring to be connected between the storage system and its control circuits and the control circuits of the transfer hoist.

The OHT vehicle 131 can transfer FOUPs to and from both active ports and all loadports, but it is not necessary for the OHT to transfer FOUPs to and from the loadports. The transfer hoist can transfer FOUPs from the storage system to the loadports on request from the tool without waiting for the arrival of an OHT vehicle. The OHT can deliver FOUPs to the storage system to maintain an inventory of FOUPs to be processed by the tool without regard for the status of the tool loadports. The OHT can pick up processed FOUPs from either the tool loadport or the storage system. In one case the processed FOUP could wait on the loadport until an OHT was available to remove it, if that loadport was not needed to start processing on a new FOUP. In the other case, where the loadport with the processed FOUP was needed to start processing on a new FOUP, the processed FOUP could be moved with the transfer hoist to an active port, which would load it on to an empty storage shelf, then a new FOUP would be moved from storage shelf to active port to transfer hoist to the recently vacated loadport.

Figure 16:
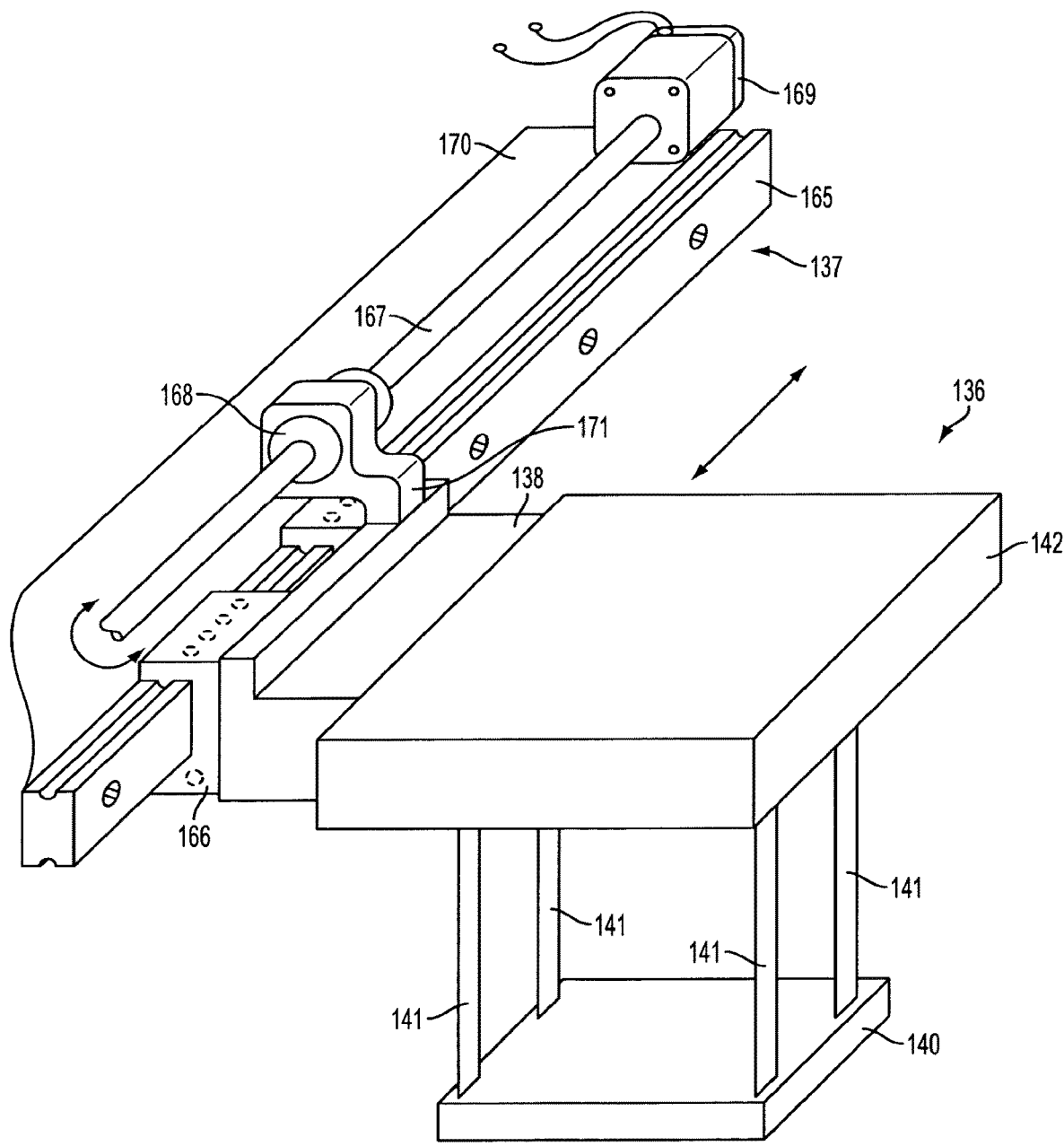
FIG. 16 is a view of a transfer hoist of the present invention.
Figure 17:
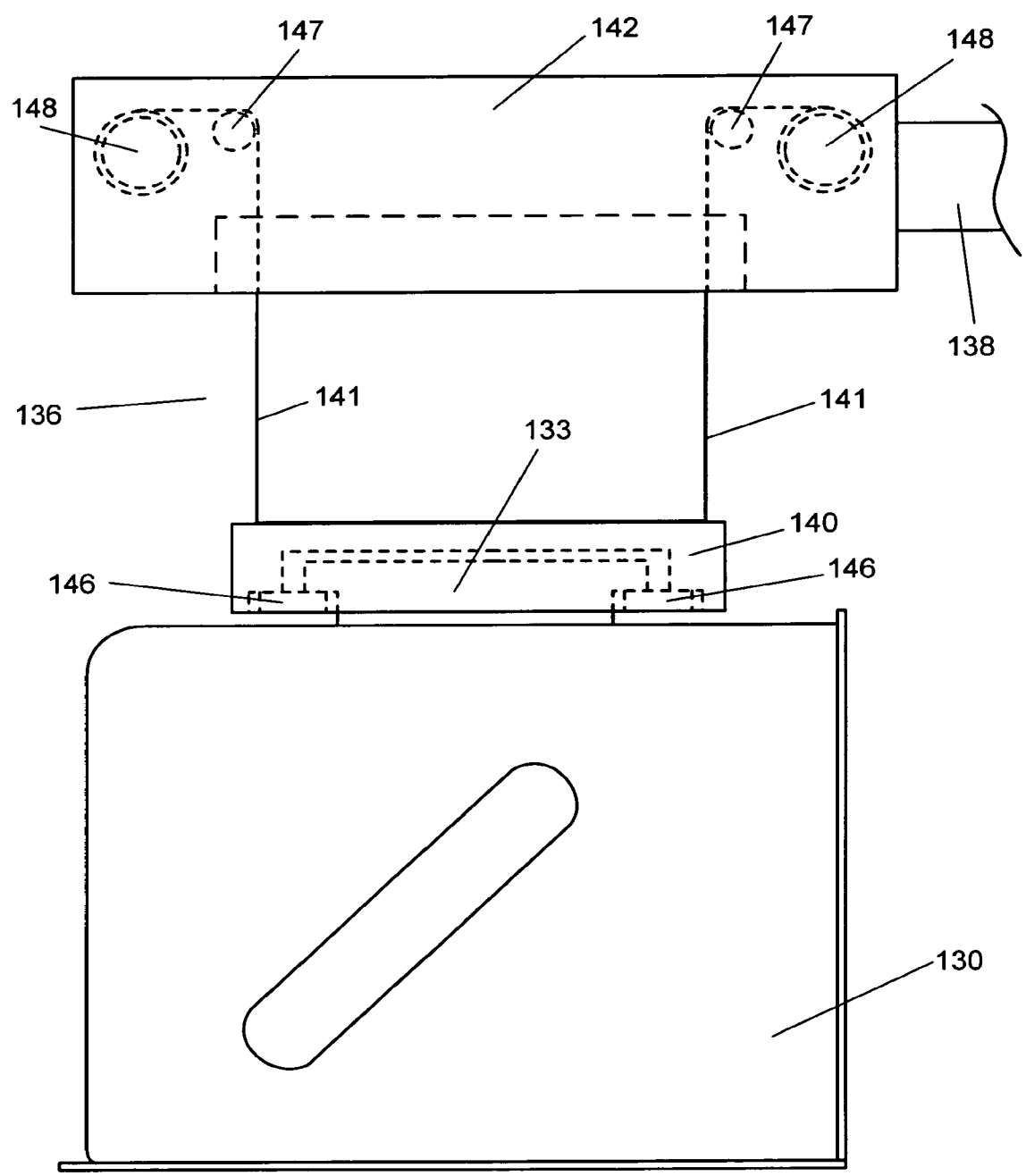
FIG. 17 is another view of the transfer hoist of the present invention.

FIGS. 16 and 17 provide design details for the transport hoist 136. In general, the transport hoist has many of the same features as the hoist mechanism on an OHT; retracting belts that move a FOUP gripper mechanism between a lower elevation and a higher elevation. Hoist frame 142 contains electric motors that rotate belt drive pulleys 147, retracting transfer hoist belts 141 into hoist frame 142. The retracted belt is rolled on to belt wrap pulleys 148 which provide a continuous wrap torque. Transfer hoist belts 141 are connected to transfer hoist gripper 140, therefore retraction of the transfer hoist belts into the transfer hoist frame results in vertical motion of the transfer hoist gripper. Transfer hoist gripper 140 envelops the periphery of FOUP top handle 133 and then gripper latch 146 is activated, positioning the gripper latch under the bottom edge of the FOUP top handle. With the support of the gripper latch, the FOUP can then be lifted from the support surface it has been resting on. Power and communication between the transfer hoist frame and the transfer hoist gripper is provided by wires that are embedded in the transfer hoist belt. Alternatively, the gripper could be battery powered, and battery recharging would be accomplished through electrical contacts when the gripper is raised to the transfer hoist frame. In the case of the battery powered gripper, communications would be wireless, either through radio frequency transmission, or through light beam transmission (visible or infra-red).

FIG. 16 shows additional details of the hoist linear drive assembly 137. Plate 170 provides support for horizontal drive motor 169 and hoist linear rail 165. Linear rail bearings 166 attach to cantilever support 138 along with ball nut mount 171. Ball screw 167 attaches to the shaft of the drive motor and passes through ball nut 168 which is held by the ball nut mount. As the drive motor shaft is rotated, the ball nut and ball nut mount push the cantilever support and hoist laterally as it slides on the rail 165 and bearings 166. For clarity, cables that supply power and control signals to the hoist are not shown.

Alternative components could be used in the hoist linear drive assembly. For example, the rotary type motor 169 could be replaced with a linear motor having permanent magnets mounted on plate 170 and a winding assembly attached to the sliding cantilever support block. Alternatively, a leadscrew and nut could replace the ball screw and ball nut, or the linear bearing could be replaced by a pair of parallel guide shafts and tubular bearings.

Figure 2:
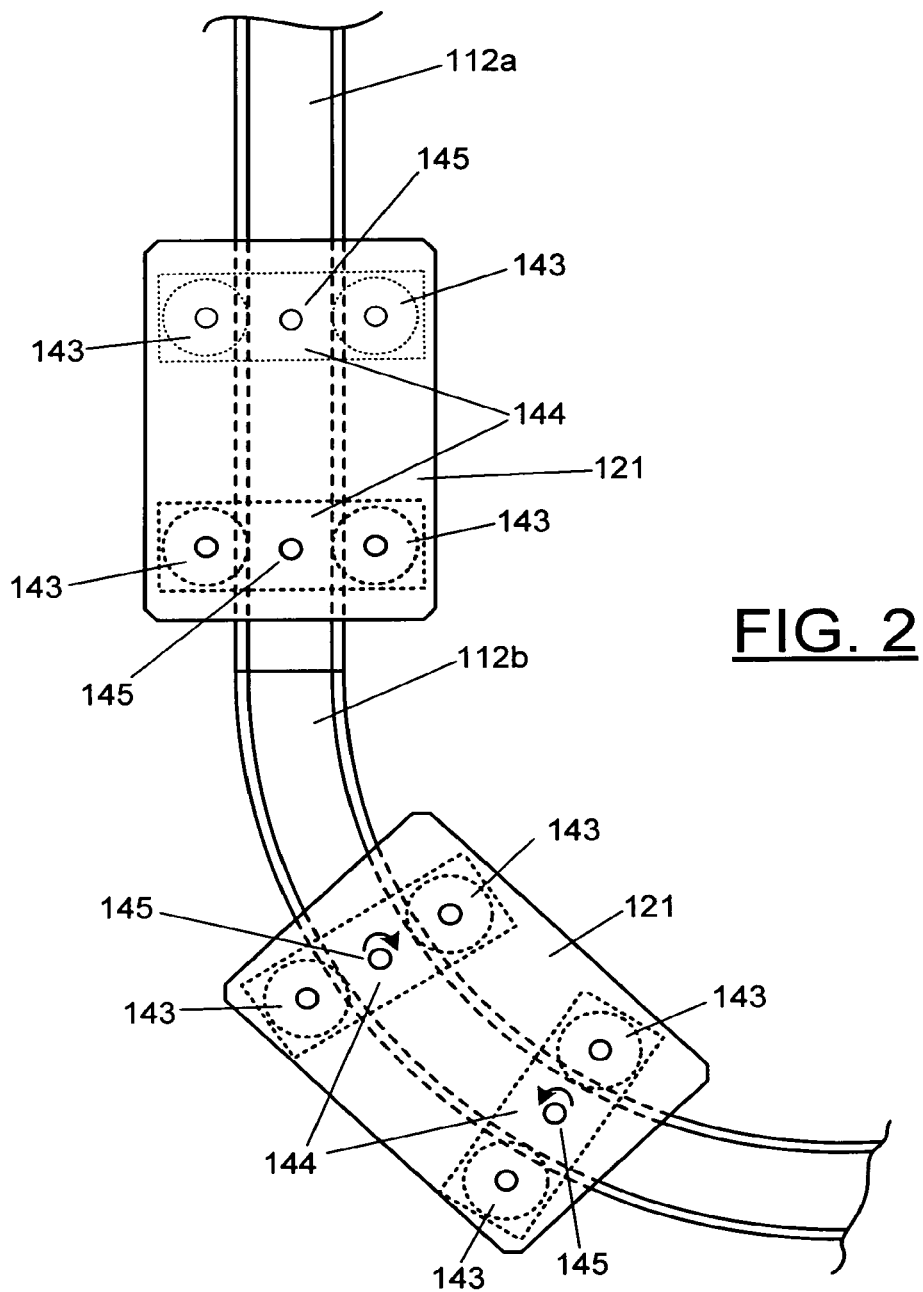
FIG. 2 is a plan view of the curved guide rail and bearing truck.
Figure 3:
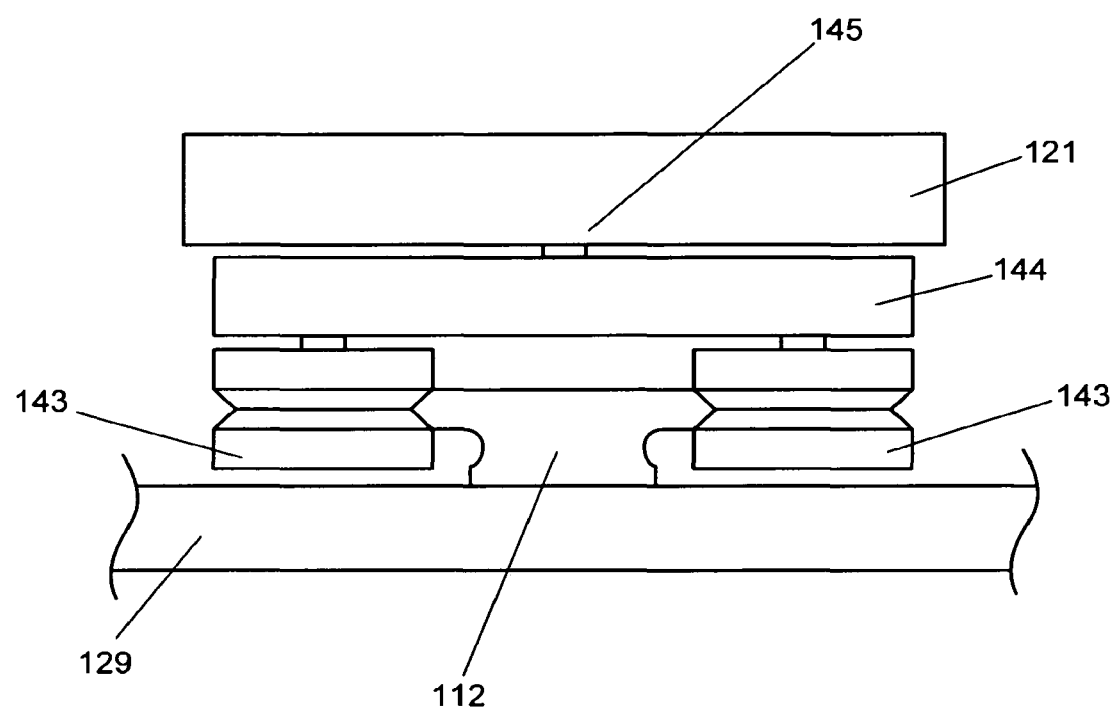
FIG. 3 is a side view of the rail and bearing truck.

FIGS. 2 and 3 show details of the bearing assembly that guides and supports the storage shelves. Several companies, such as THK Co., LTD and Bishop—Wisecarver Corporation provide bearing/rail systems that can be used to support motion around a combination of straight and curved rail or track. THK Co. provides a product called "Straight—Curved Guide HMG", and Bishop—Wisecarver provides their "PRT Track System" with curved and straight sections. Several methods are known in the art for moving between curved and straight rail sections, and the drawings in FIGS. 2 and 3 are but one example. A bearing plate 121 would support a storage shelf. Each bearing plate would be connected by a pin and a roller plate bearing 145 to each of two roller plates 144. The roller plates 144 can freely pivot about roller plate bearing 145 and each mount 2 rollers 143, each of which can rotate on a bearing. The rollers are spaced such that they provide a lateral force that grabs the rail from each side. As the bearing truck moves around the curved rail the roller plate can pivot to allow unhindered motion. The rail can take on several structural configurations, so long as a track is provided for completing a loop.

Figure 18:
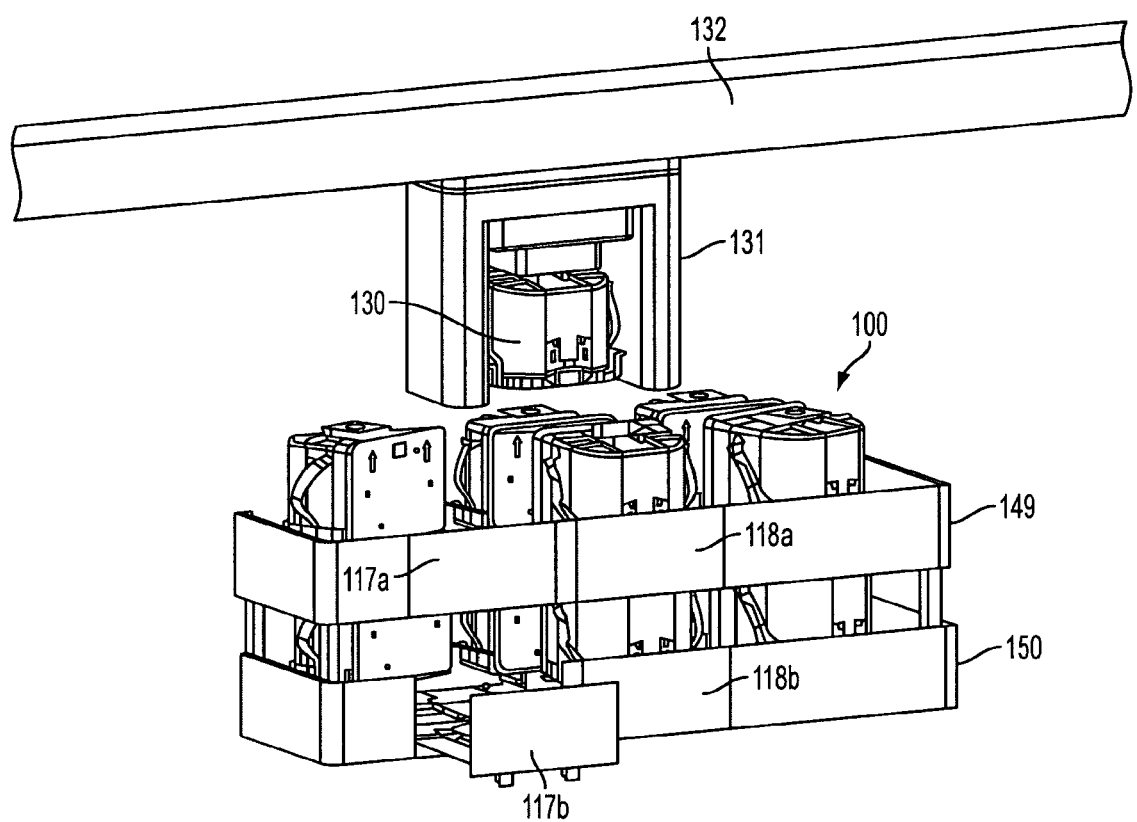
FIG. 18 is another view of the present invention with multiple storage levels.

FIG. 18 shows a storage system with two levels of storage loops that are vertically stacked. Upper level storage 149 has active ports 117*a* and 118*a*. Lower level storage 150 has active ports 117*b* and 118*b*. The figure shows a FOUP 130 ready to be loaded on to active shelf 117*b*, which is extended. Active port 117*a*, which is above active port 117*b*, must be retracted for OHT vehicle 131 to have unobstructed delivery of the FOUP to active port 117*b*, however active ports 118*a* or 118*b* could be extended, for example, with a FOUP ready to be picked up by an OHT vehicle. A multi-level storage system of this type could have more than two levels, with different locations and quantity of storage shelves. FIG. 18 shows the storage system 100 mounted directly below the ceiling mounted OHT, however, the storage system could be at any elevation. The storage system 100 could be supported by a floor-based structure, a ceiling structure, the AMHS structure, or a combination thereof. The storage system could also be supported by the structure of a tool or other fab facility feature.

Figure 20A:
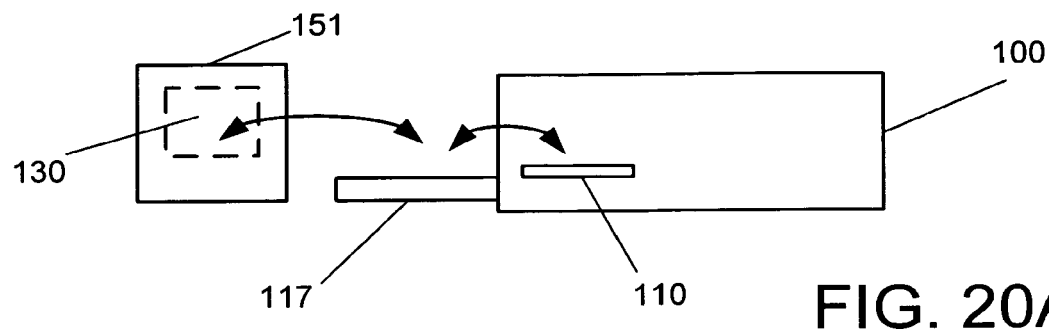
FIGS. 20a, 20b, and 20c are elevation views of different configurations of the present invention with AMHS.
Figure 20B:
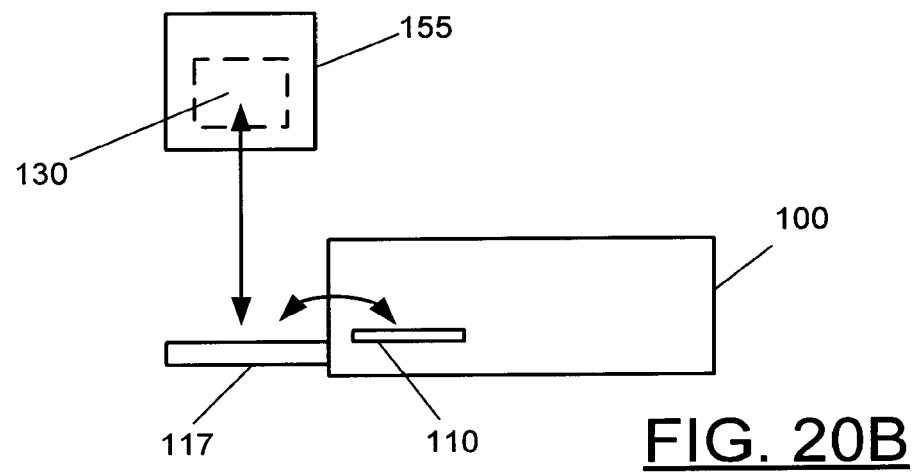
Figure 20C:
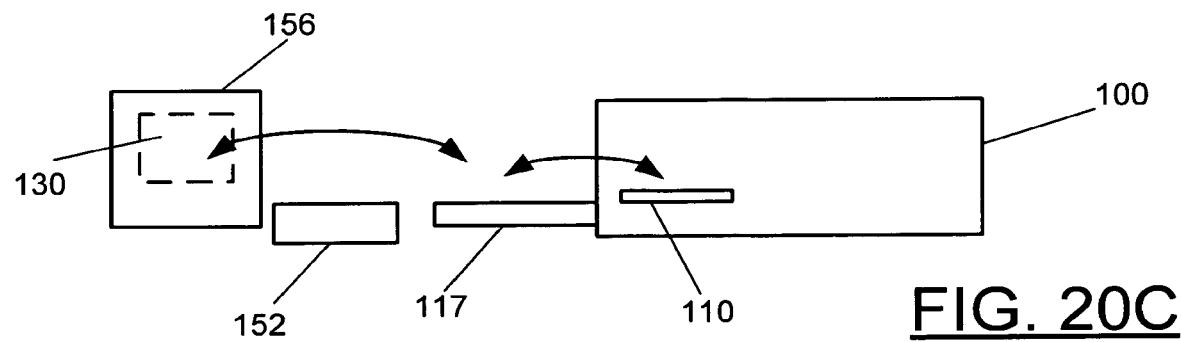

FIGS. 20*a*, 20*b*, and 20*c* are simplified side views of the storage system with an active port that show how it could transfer FOUPs with different basic types of AMHS. The arrows show the path of the FOUP during transfer. FIG. 20*a* shows an AMHS 151 that is located to the side of the storage system. This type of AMHS has a transfer device built into it that can load the FOUP on to the extended active port 117 which can then retract and transfer the FOUP to a storage shelf 110. FIG. 20*b* shows an AMHS 155 (such as OHT) that lowers the FOUP on to the active port 117, which then retracts and transfers the FOUP to a storage shelf 110. FIG. 20*c* shows an AMHS 156 without integral transfer device that is located to the side of a storage system. This AMHS type requires an external transfer device 152 that can pick up the FOUP from the AMHS 156 and move it to active port 117, where it can then be moved to storage shelf 110.

Figure 21A:
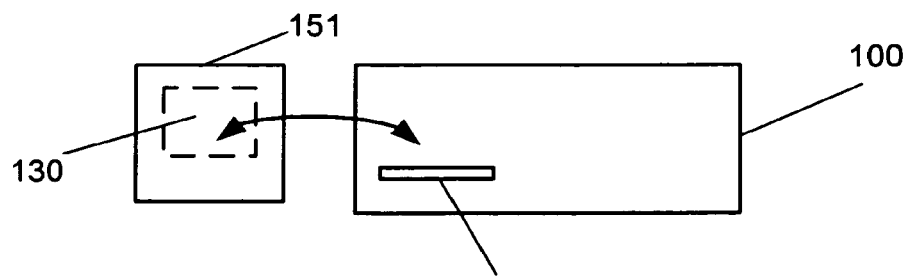
FIGS. 21a, 21b, and 21c are other elevation views of the present invention with AMHS.
Figure 21B:
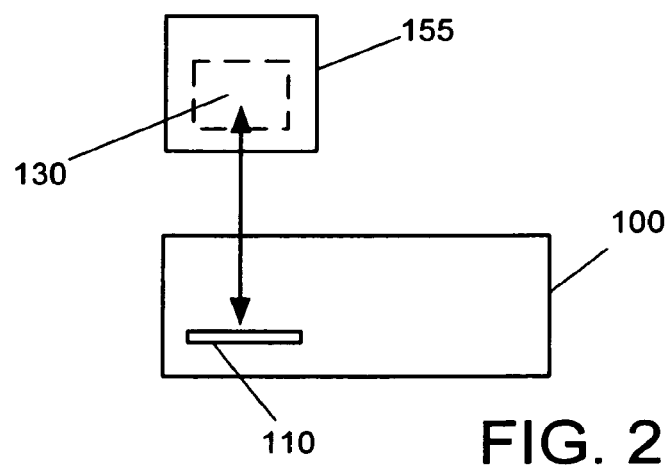
Figure 21C:
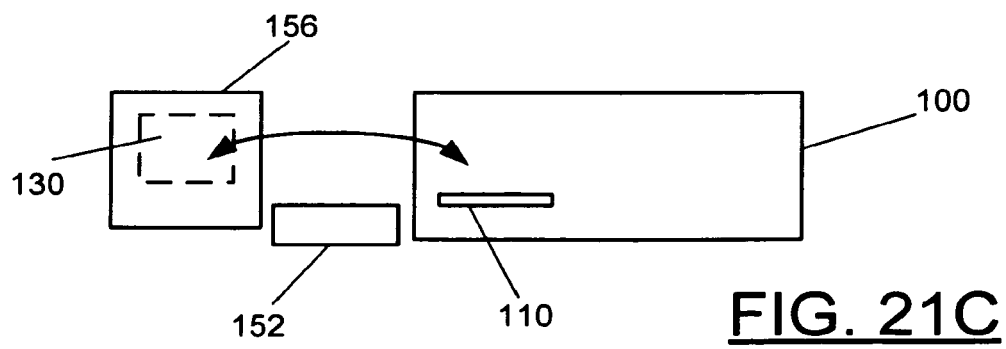

FIGS. 21*a*, 21*b*, and 21*c* are simplified side views of the storage system without active ports that show how it could transfer FOUPs with different basic types of AMHS. The arrows show the path of the FOUP during transfer. FIG. 21*a* shows an AMHS 151 that is located to the side of the storage system. This type of AMHS has a transfer device built into it that can load the FOUP directly on to storage shelf 110. FIG. 20*b* shows an AMHS 155 (such as OHT) that lowers the FOUP directly on to storage shelf 110. FIG. 20*c* shows an AMHS 156 without integral transfer device that is located to the side of a storage system. This AMHS type requires an external transfer device 152 that can pick up the FOUP from the AMHS 156 and move it directly to storage shelf 110.

Figure 22:
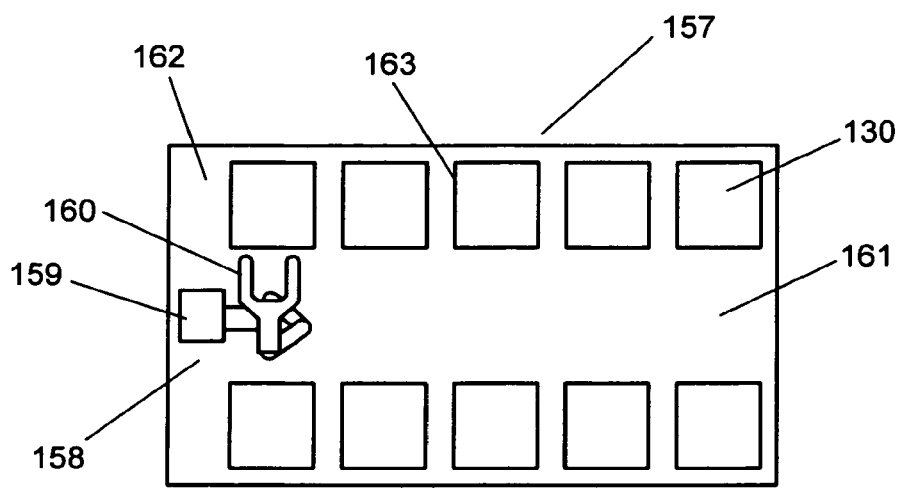
FIG. 22 is plan view of the floor space used by a conventional stocker.
Figure 23:
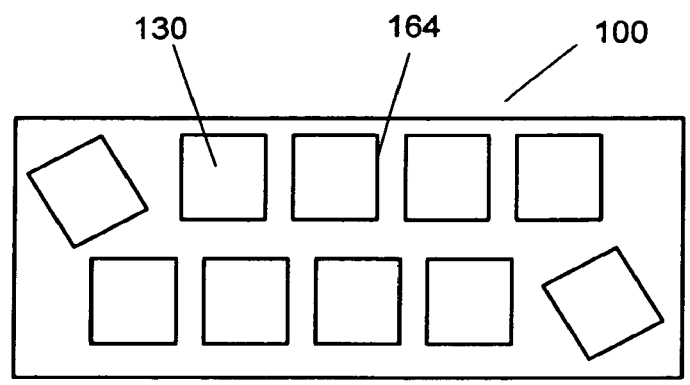
FIG. 23 is a plan view of the reduced space needed for one embodiment of the present invention.

FIGS. 22 and 23 are simplified plan views that show the relative floor space used by a conventional stocker, and by a storage system of the present invention. Each of these figures is showing one level of storage positions, and either the conventional stocker 157 or the storage system 100 could have multiple levels of the shown FOUP arrangement. In FIG. 22, conventional stocker 157 has ten FOUPS 130 arranged in two rows of five FOUPs. The two rows of FOUPs are separated by stacker robot clearance space 161 that is required to move stacker robot 158 horizontally for access to the stored FOUPs. Stacker robot 158 has vertical column 159 that moves stacker robot arm 160 vertically to align with each level of storage. Stacker robot end space 162 is required for vertical column 159 when accessing the leftmost FOUPs in the storage level. Stacker robot clearance space 161 must be wide enough to accommodate a FOUP plus parts of the robot arm as it is rotated 180 degrees between storage positions on either side of the clearance space 161. In contrast, the storage system 100 of the present design shown in FIG. 23 uses much less floor area for the storage of ten FOUPs 130. Storage system 100 does not require a stacker robot, therefore the clearance spaces 161 and 162 in FIG. 22 are eliminated, resulting in a much denser arrangement.

FIGS. 22 and 23 also show the improved efficiency of motion for the storage system 100 of the present invention. To retrieve a FOUP from storage location 163 in FIG. 22, the stacker robot 158 must first move horizontally to align with the storage location, then motors in the stacker robot arm 160 extend the arm under the FOUP, then a motor lifts the arm with the FOUP, then the arm motors retract the arm and FOUP, and then the stacker robot can move horizontally to the desired destination port. In FIG. 23, the storage system 100 of the present invention only has to operate a single motor to move all FOUPs simultaneously until the shelf an FOUP that was at position 164 is moved 3 or 4 positions, for example, using only a fraction of the time that the conventional stocker used for retrieval of a FOUP.

Figure 24:
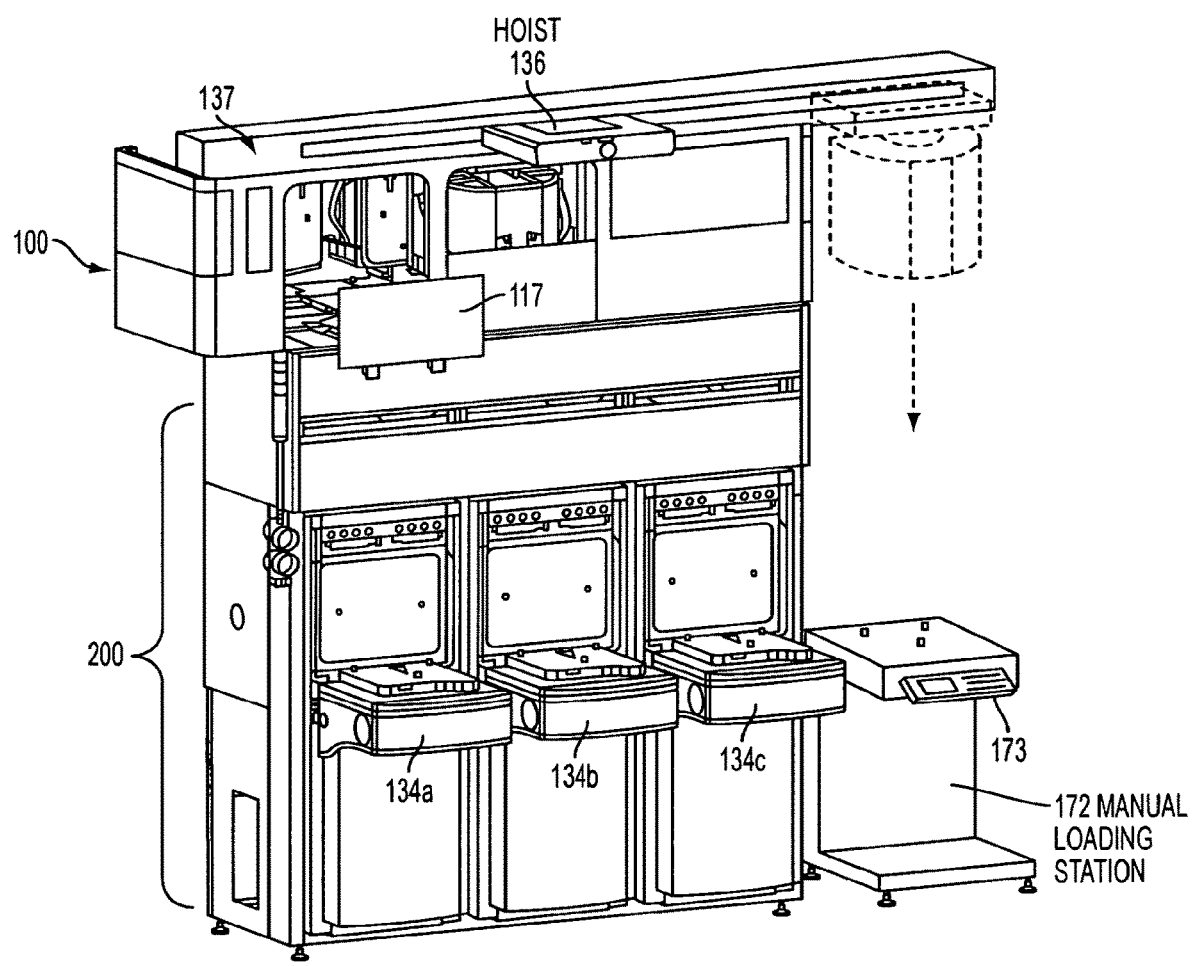
FIG. 24 shows an embodiment where an extended track and hoist is interfacing with a manual loading station, in accordance with the invention.

FIG. 24 shows an embodiment of the current invention that is used as a stand alone tool storage system without a ceiling mounted AMHS delivery system. Hoist linear drive 137 (e.g., horizontal track) has been lengthened to extend it over the area to the side of the assembly 200 of the tool, allowing transfer hoist 136 to be positioned over manual loading station 172 located to the side of the tool. The manual loading station is therefore at a side the tool. As used herein, "at a side" means that the manual loading station can be near the tool, so long as the manual shelf is beside or near the container load zone. In this case the containers are placed on the manual loading station where they can be picked up by the transfer hoist and then raised to an upper position. From that position the transfer hoist moves laterally to align over a tool loadport 134 or an active port 117, then lowers and deposits the container on the loadport or active port. The transfer hoist can move containers between; a) manual loading port and active port, b) active port and loadport, or c) manual loading port and loadport. The manual load station is shown having a manual load shelf, with features for holding, engaging or connecting to a container when placed thereon. In one embodiment, the features are pins, and the pins mate to corresponding underside recessed sections of a container. Furthermore, the manual load station can take on various configurations, such as moveable floor based transport or handling systems. For example, rail guided vehicles, automated transfer carts, or human placed containers on movable transport systems. Still further, for clarity, the manual load shelf does not need to be part of a manual load station, and any structure of mechanism that can support a container and receive containers can function as a manual load shelf.

FIG. 24 shows the type of container and loadport used for 300 mm silicon wafers, however, the same concept would apply to containers used for other sized wafers, such as 200 mm or 450 mm. 200 mm wafer containers differ in that they have a bottom opening door, but they have a similar top handle for engagement with the transfer hoist and they are loaded on to a horizontal support surface on the tool, therefore they do not significantly change the operation of the manual loading or buffer delivery.

The use for the system in FIG. 24 would be to allow a human operator to load multiple containers into the storage system 100. The storage system could then load the containers onto the tool as needed and remove the containers to the storage system 100 after processing, using the transfer hoist. The operator could then retrieve the processed containers of wafers at a later time, minimizing the need for the operator to more frequently manually load and unload each loadport. Some type of operator interface, preferably an operator interface 173 mounted on the manual loading station, would allow the operator to enter storage and container information during the loading or unloading process. The manual loading station could have automatic container identification means to allow for identification of the container as it is loaded or unloaded. Several different methods are common in the semiconductor industry, such as bar code readers, RFID (radio frequency identification), and infra-red communication to a battery powered, container mounted identification module.

It is also possible that a stand alone system as shown in FIG. 24 could be used for the processing and storage of containers of any horizontal substrate. There would be no substantial difference with the system shown in FIG. 24 as long as the tool had horizontal loading surfaces for the transfer hoist to lower the container on to, and the tool had an access port that would allow access to the substrates for loading into the process tool by the tool's substrate handling apparatus.

Figure 25:
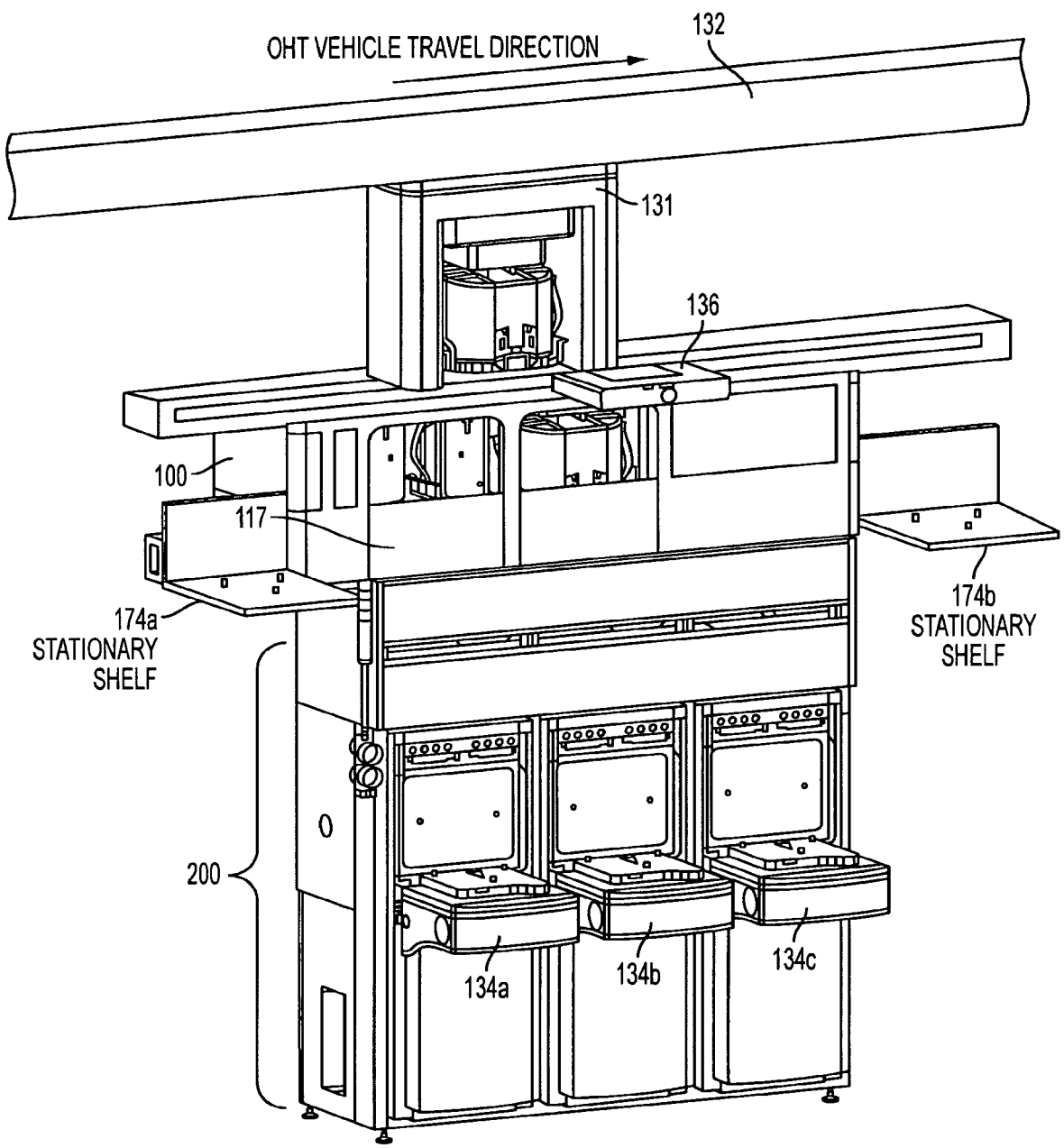
FIG. 25 shows an embodiment where stationary shelves are coupled to the storage system assembly, in accordance with the invention.
Figure 26:
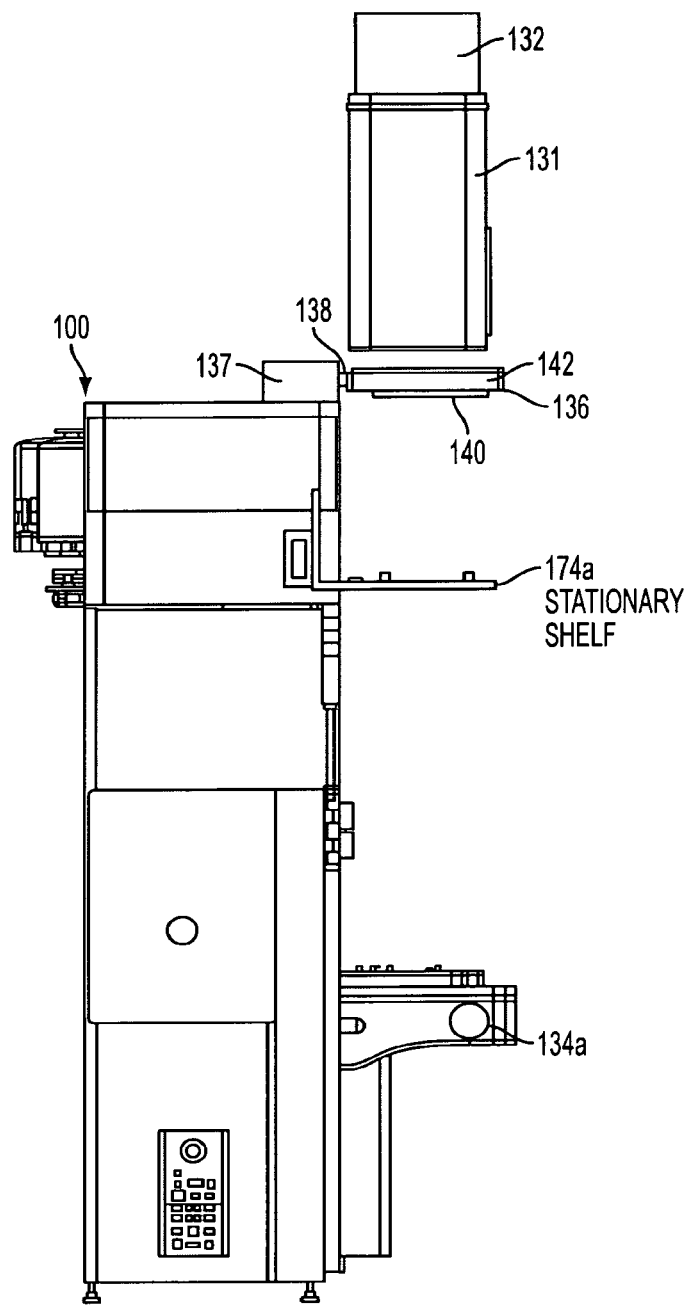
FIG. 26 shows an example side view of FIG. 25, in accordance with the invention.

FIGS. 25 and 26 show yet another embodiment of the current invention that uses stationary shelves 174a and 174b positioned at the sides of the storage system 100, providing a simpler method for OHT drop off and pick up of containers. For example, one or more of the stationary shelves 174 can be oriented beside the frame of the storage system assembly. In this manner, a stationary shelf 174 will be positioned outside of the track of the storage system assembly. Still further, the stationary shelf can be coupled to the storage system assembly in many ways. One way is to couple to the frame of the storage system assembly or another structure. Unlike active port 117 which can be in a retracted position, stationary shelves 174a and 174b are always in a position under the travel of the OHT vehicle and the transfer hoist because they are rigidly mounted to stationary structural elements, such as the structure of storage system 100. In one example embodiment, the stationary shelves 174 are also oriented in the same direction as a load port shelf of the tool below and an extended active port 117.

For purposes of clarity, it should be understood that the stationary shelf can be connected to any location that is proximate to the storage system assembly 100. For instance, the stationary shelf can be connected on the same side as a face of one of the active port 117 or 118, so long as the stationary shelf does not block vertical hoist access or OHT access to a load port shelf. The face, however, is where no active port exists, such as to the right of active port 118.

If OHT vehicle 131 arrives at tool assembly 200 for the purpose of dropping off a container, transfer hoist 136 may be in the process of moving laterally over the active port 117 or the loadports 134a, 134b, or 134c during the transfer of containers between the storage system 100 and the loadports. In that case the OHT would be required to wait if it had to interact with the active ports, but the stationary shelves are outside of the transfer hoist's range of motion during storage system to loadport transfers, so the OHT will be free to deposit the container at the stationary shelf without concern for interaction with these other transfer operations.

With the stationary shelves installed there would be no need for the OHT vehicle to stop over the loadports unless there was a malfunction in the operation of the storage system or transfer hoist. In that case, the AMHS and storage system could be put in an alternate mode of operation. The storage system operation would be disabled, the transfer hoist would be moved over one of the stationary shelves, and the OHT vehicles would deliver containers directly to the tool's loadports. While this type of operation would not take advantage of the capabilities of the storage system, it would still allow the tool to operate while the malfunction is being corrected.

Another advantage of the stationary shelves is that a container can be placed on one for pick up by an OHT vehicle without occupying the position on an active port. The timing of the arrival of an OHT vehicle for pick up is uncertain, and placement of the container on a stationary shelf eliminates the need for the container to occupy an active port, which could interfere with other transfers.

Yet another advantage of the stationary shelves, if two or more are used, is that one could be designated as a drop off shelf and the other as a pick up shelf. OHT vehicles usually travel only in one direction along OHT rail 132. The drop off shelf could be designated as the shelf 174a that the OHT vehicle first traverses as it approaches the tool, and the pick up shelf could be the shelf 174b positioned after the OHT vehicle travels further, which is usually the shelf on the other side of the tool. If shelf 174a was empty and shelf 174b had a container to be picked up, a single OHT vehicle could drop off a container at shelf 174a and then, after a short move, pick up the waiting container at shelf 174b. This method can reduce the overall traffic of OHT vehicles by reducing the number of scheduled OHT vehicle moves due to the combination of a container drop off and a container pick up into a single pass by a vehicle.

Thus, the transfer hoist can: (i) pick or place containers to or from the stationary shelf; or (ii) pick or place containers to or from the load port shelf; or (iii) pick or place containers to or from the stationary shelf and the load port shelf; or (iv) pick or place containers to or from a port plate of the storage system assembly, the stationary shelf, or the load port shelf. Still further, the OHT is connected to track above the storage system assembly, the horizontal track of the transfer hoist is oriented below the track of the OHT, the storage shelves, the port plate, and the stationary shelf are oriented below the transfer hoist, and the load port shelf is oriented below the storage shelves, the port plate, and the stationary shelf. And, each is installed in a room having a floor over which the tool is installed. The room can be a fab, a laboratory, a clean room, or any structure. Referencing items to be below or above can be with regard to a reference, and the reference can be a floor of the room.

FIG. 26 shows how OHT rail 132, OHT vehicle 131, transfer hoist 136, stationary shelf 174a, and loadport 134a occupy substantially the same vertical plane.

Figure 27:
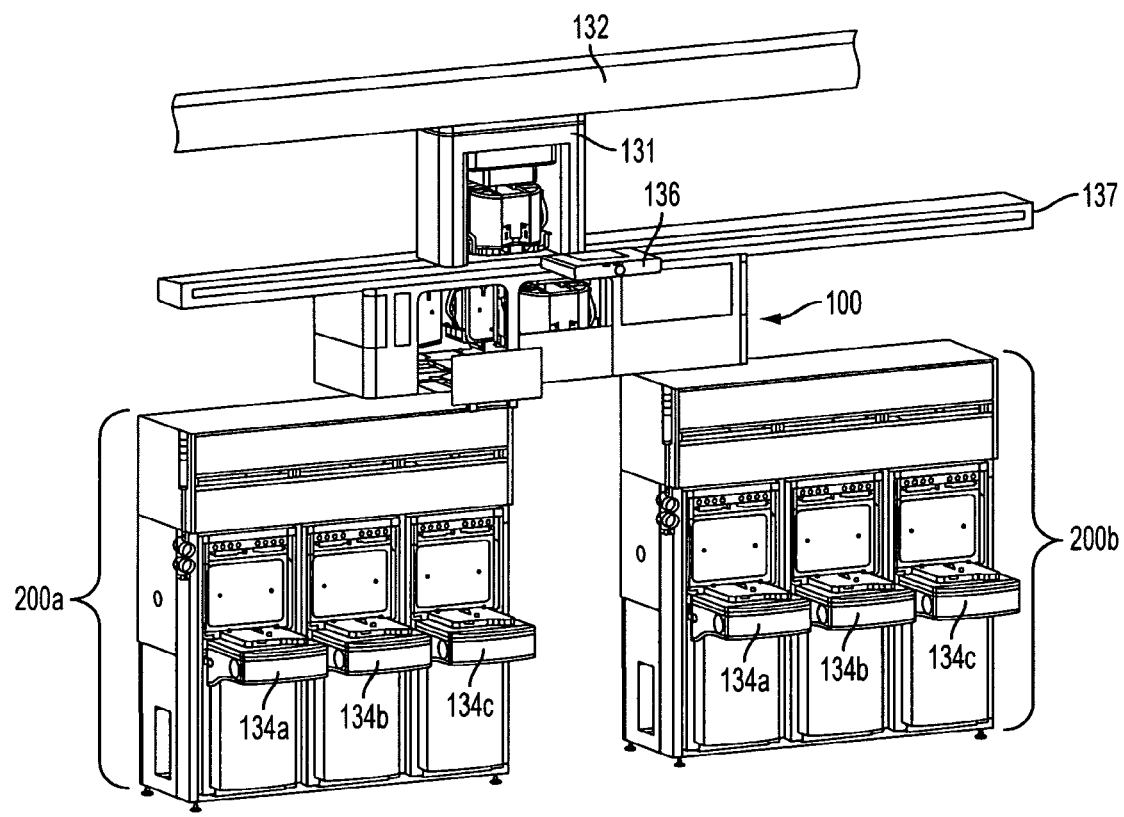
FIG. 27 shows an embodiment where the extended track spans more than one tool, in accordance with the invention.

FIG. 27 shows a Multi-Tool application for the storage system. A storage system could be located between or across two tools 200a and 200b, allowing the transfer hoist 136 to move containers between tools without assistance from OHT vehicles, and providing tool-to-tool buffering. This could be very efficient if, for example, a metrology step is required after a process step. The container could go back into the storage system after the process, in a queue, to be measured by the metrology tool when it is next available. The transfer hoist 136 could extend over both tools by extending the hoist linear drive 137. In one embodiment, a horizontal track is oriented above at least part of the storage system assembly. In another embodiment, the horizontal track extends beyond a side of the storage system assembly. Extending beyond a side shall mean any side, and can include extending beyond more than one side of the tool or storage system assembly. In one example, the horizontal track can be oriented over one or more tools. A transfer hoist is connected to the horizontal track to enable the transfer hoist to move along the track over the one or more tools, and the transfer hoist is configured to pick or place containers. In still another embodiment, the horizontal track extends beyond a side of the storage system assembly, whereby a section of horizontal track is at least partially oriented over a section of a conveyor. A transfer hoist connected to the horizontal track can then move along the track over the section of the conveyor to enable picking or placing of containers.

The storage system assembly could be supported from the floor, the tool structure, the OHT frame, or the ceiling. The storage system could be over both tools, in-between the tools, or mounted over one of the tools. Either way, the hoist linear drive would be extended so that transfer hoist could be positioned over all of the loadports on both tools.

It may be desirable to have a safety shield made out of clear plastic or other material to restrict the operator from the vertical load area unless they are manually accessing a container. There could be access doors with signal switches to prevent the transfer hoist from vertical motion if a door is open. Another possibility is that the shield would be open at the loadports, but only to the height of the top of the container. This would prevent an operator from leaning into the vertical travel area while still allowing hand access at the container height. If this open concept was used it could be combined with optical "break-the-beam" sensors across the openings at the loadports to signal the transfer hoist controller to prevent vertical motion if an operator was breaking the beam of the sensor at an opening. A third option would be to use a full "light curtain" in front of the tool without any physical shield. If the operator interrupted any of the light beams, transfer hoist operation would be restricted.

There are a variety of ways that the storage system could be interfaced to the tool and the fab automation system, however, there are two common ways of organizing the interfaces; a) as a system controlled by the fab Manufacturing Control System (MCS), or b) as a system integrated and controlled directly by the tool. In case b), the tool would communicate with the fab's control systems to indicate empty storage locations and containers that have completed processing. Typically a tool will communicate only that it has a completed container for removal and the fab's control systems will keep track of the status of the tool's storage locations (loadports). The tool usually does not determine if containers should be delivered for processing—the scheduling of new work is done by the fab systems. In this "tool controlled" method, the tool would somehow represent to the fab systems that it has more container delivery positions than the number of loadports that it has, and allow the fab to associate delivery/retrieval positions as well as process instructions with these locations. This "tool controlled" method may not have all its messages conform to SEMI standard protocols, and may require customization of the fab communication interfaces. In case a), the tool would essentially operate as it does without a storage system. Delivery of containers for storage in the storage system, and transfer of containers to and from the tool loadports would be controlled by SEMI standard message protocols between the fab Manufacturing Control System (MCS) and the storage system. This MCS control could be done using SEMI E88 (Specification for AMHS Storage SEM), the standard that is usually used to control transactions with a stocker. E88 messages cover the interactions required to load, unload, and track containers into a storage system such as a stocker, or in this case, a storage system of the present invention. There are E88 commands to move material in the stocker to a port, and these could be used to move a container from a storage location in the storage system to a loadport. Another option would be to use E82 commands (Specification for Interbay/Intrabay AMHS SEM) rather than E88 for the movement of the containers between the storage system and the loadports.

There will be many storage system operations that can be improved with efficient coordination of the OHT and the transfer hoist motions. Ideally, the fab material control system would send a message to the storage system as the OHT was approaching the storage system, identifying its access port (loadport #, active port #, or stationary shelf #) and action (pick up or drop off container #). This could be done through the storage system fab communication interface, such as an Ethernet port, or directly, with a wireless link (such as Wi-Fi IEEE 802.11 or Bluetooth IEEE 802.15) between the OHT and the storage system. The message could be transmitted to the storage system when the OHT vehicle passed a pre-identified path position near the storage system. By sending this "approach notification" message, the storage system could prepare for the OHT's arrival in several ways, including; a) clearing access to the identified loadport, b) extending the identified active port to receive a container, c) extending identified active port with identified container for OHT pick up, or d) clearing the identified stationary shelf in preparation for arrival of a container.

If the coordination methods described above are not available, then there would be increased probability that the transfer hoist or active shelves would be in an interfering operation when an OHT vehicle arrives at the tool. OHT operation would usually be given priority because any OHT delay could cause other OHT through traffic to stop, however, short OHT delays might be acceptable if the OHT was on a bypass rail rather than the main rail that all through traffic was on. An OHT bypass is a section of OHT rail that diverges from the main rail and runs by a tool or group of tools, and then merges again with the main OHT rail.

All OHT material transfers to loadports or stocker ports are interlocked with signals that conform to the SEMI E84 standard. If there was no pre-notification, the loadports on the tool would not have information about the pending arrival of an OHT vehicle, up until the time when the first E84 signals are asserted by the OHT. These are usually transmitted through an optical link that is aligned when the OHT vehicle is correctly positioned over the loadport (or shelf or port). The E84 standard prescribes an exchange of several signals that assure that each step of a transfer is allowed and that it is successfully completed.

There are many ways that a conveyor delivery system could be integrated with the operation of the storage system of the present invention. See FIG. 28 and FIG. 29 for one example of a configuration. The main conveyor segment 175 transports containers along a row of tools/EFEMS, with side delivery segments 176a and 176b that are at the side of the tool/EFEM. In the example, as seen in FIG. 29, the container 177 would stop at the end of the side delivery segment at a position that is under the transfer hoist so that it can be picked up by the transfer hoist and delivered to an active port or a tool loadport. In one embodiment, the stop position can be a section of the conveyor. If there also is an OHT system in use it also could also be aligned over the conveyor stop position as well as the loadports and active ports, creating a very flexible automation system. For example the conveyor could be used to link a small group of tools with high transfer rates, while the OHT is used to move the containers out of the area. The side delivery conveyor could also be used to queue a short line of containers before they are picked up by the transfer hoist. This might be useful if the transfer hoist is busy with other transfer operations, allowing the main conveyor to offload 2 or 3 more containers that were scheduled for delivery without causing any disruptions or bypassing on the main conveyor line.

Figure 28:
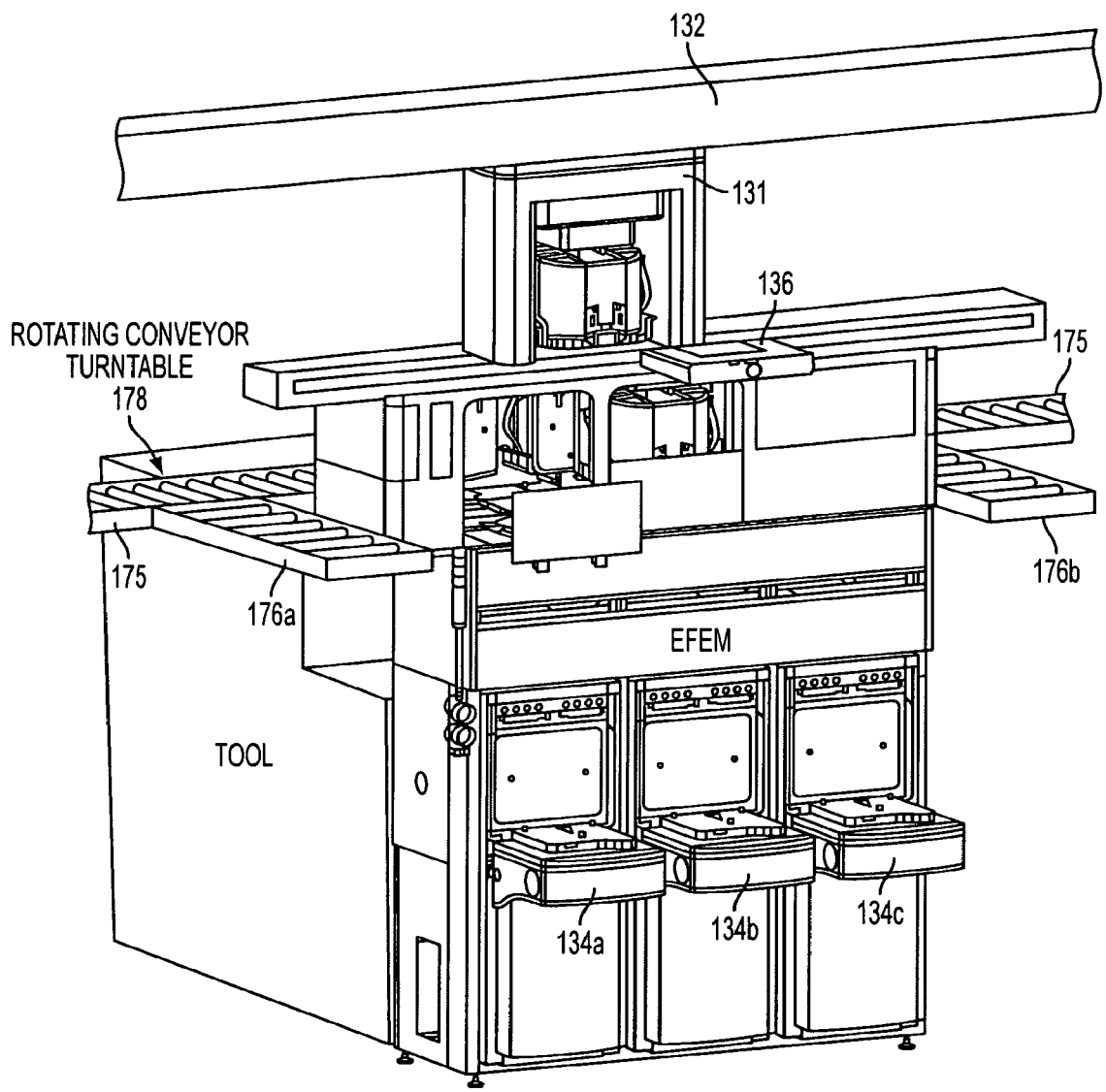
FIG. 28 shows an embodiment where a conveyor is coupled to the storage system assembly, in accordance with the invention.
Figure 29:
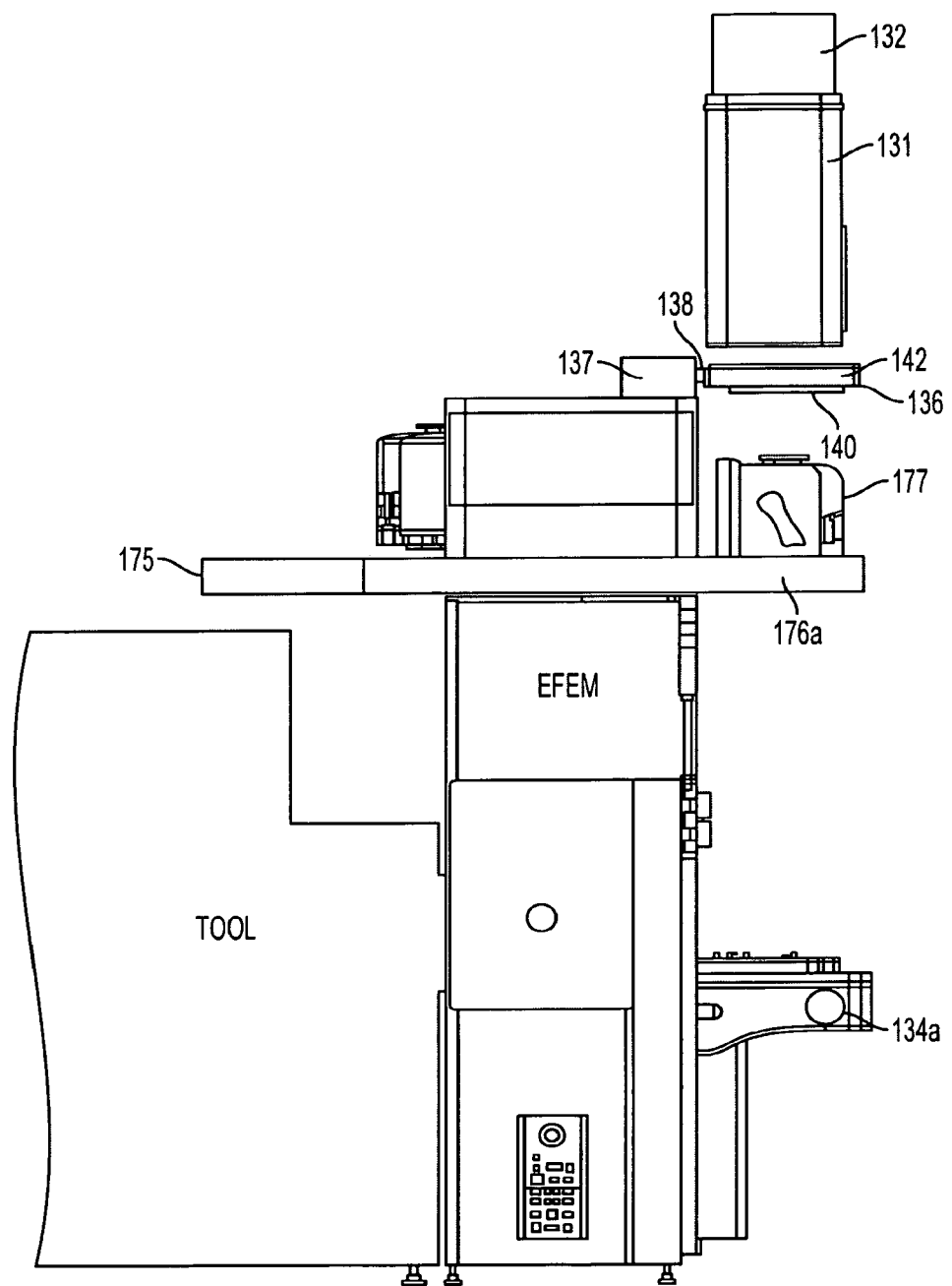
FIG. 29 shows an embodiment of a side view of the conveyor, in accordance with the invention.

FIG. 28 shows two side conveyor segments 176a and 176b, one on each side of the tool. One could be for container delivery and the other could be for a container exit segment, however, the association of container delivery and removal to individual side conveyors could be dynamically changed if the situation was called for. An example of dynamic association would be to have both segments deliver containers if the storage system needed to be filled from an empty state as quickly as possible, in which case both side segments could fill up their queues to the limit with arriving containers. After the storage system was filled, one of the side segments could be changed to an exit segment.

FIGS. 28 and 29 show the main conveyor segment placed behind the storage system, however, it could just as easily be in front of the storage system over the aisle in front of the loadports. The side conveyor segments would still be perpendicular and they still would extend to a point where they deliver the container to a position that is under the transfer hoist. The intersection between the main conveyor section and the side sections require some type of transfer device, many of which are already well known. For example, there could be a rotating conveyor turntable 178 with a short conveyor section mounted on it. The container would travel on the main conveyor until it is on the turntable, the turntable would then turn and allow the container to roll off in the direction of the side conveyor.

Most of the drawings show, for simplification, only a tool Equipment Front End Module (EFEM) without a tool connected. FIGS. 28 and 29 show where the tool can be located behind the EFEM. In the descriptions above, a tool would include all parts connected to it including loadports, or EFEM or the storage system itself.

Broadly speaking, an OHT system is a material delivery system for a semiconductor manufacturing facility. OHT vehicles carry containers of semiconductor wafers while traveling on a ceiling supported rail system. The containers (FOUPS in the case of 300 mm wafers) are gripped by their top flange while traveling in the OHT vehicles along the rail system. The OHT vehicle can stop at loadports or other transfer stations and lower the gripping mechanism, along with the container, using a set of retractable cables. When the container contacts the loadport surface, it is accurately positioned because it mates with a set of kinematic pins that protrude from the loadport's support surface. In a similar way, an empty gripping mechanism can be lowered on to the top flange of a container on a loadport, grip the top flange, and raise the container to the OHT vehicle by retracting the cables. The OHT vehicle can load containers to transfer stations of various heights simply by adjusting the length of the cable retraction or extension for that station. This type of adjustment is done by a human controlled set up ("teaching the station"), followed by storage of the adjustment values in the OHT's control system.

It should be appreciated that the above described mechanisms and methods for storing and accessing semiconductor wafer containers are for explanatory purposes only and that the invention is not limited thereby. It should be apparent to those skilled in the art that certain advantages of these described mechanisms and methods have been achieved. It should also be appreciated that various modifications, adaptations and alternative embodiments may be made within the scope and spirit of the appended claims of the present invention.

What is claimed is:

1. A storage system comprising:
   a frame of the storage system located above and coupled to a frame of an assembly of a tool;
   a base plate coupled to the frame of the storage system, wherein the base plate is coupled to a rotating mechanism driven by a motor, wherein the base plate is oriented to define a horizontal plane, wherein the base plate is located below the motor;
   a plurality of storage shelves coupled to the rotating mechanism for horizontal movement of the storage shelves, wherein the storage shelves move together to one or more positions, wherein one of the storage shelves has a shelf plate;
   a bearing plate coupled to the shelf plate; and
   an active port assembly coupled to the frame of the storage system, wherein the active port assembly has a port plate, wherein the port plate is positioned at one of the positions, wherein the active port assembly further includes a horizontal motion assembly defining an extended position of the port plate outside of the frame of the storage system and a retracted position of the port plate inside the frame of the storage system, wherein in the retracted position, the port plate is disposed above the bearing plate and below the shelf plate.

2. The storage system of claim 1, further comprising an active port coupled to the active port assembly, wherein the frame of the storage system and the active port together form a wall that partially surrounds the base plate, the rotating mechanism, and the storage shelves.

3. The storage system of claim 1, wherein the tool is configured to process a wafer configured to be stored in a container, wherein each of the storage shelves has multiple shelf features configured to support the container when placed on top of the storage shelf, wherein the port plate has multiple port features configured to support the container when placed on top of the port plate.

4. The storage system of claim 1, wherein the rotating mechanism includes a plurality of sprockets, a rail, and a chain, wherein the sprockets includes a drive sprocket and an idler sprocket, wherein the rail is coupled to the base plate, wherein the motor is coupled to the drive sprocket, wherein the sprockets are coupled to the chain, wherein the chain is coupled to the storage shelves, wherein the motor is configured to operate to rotate the drive sprocket to further move the chain, wherein the chain moves to move the storage shelves with respect to the base plate.

5. The storage system of claim 1, wherein the bearing plate is one of a plurality of bearing plates and the shelf plate is one of a plurality of shelf plates, wherein the rotating mechanism includes a rail and the bearing plates that are supported on top of the rail, wherein the rail is coupled to the base plate, wherein the bearing plates are configured to rotate with respect to the rail, wherein the storage shelves have the shelf plates, wherein a vertical clearance is formed between the shelf plate and the bearing plate for allowing the port plate to partially surround the vertical clearance before transferring a container to the one of the storage shelves or receiving the container from the one of the storage shelves.

6. The storage system of claim 1, wherein the shelf plate is configured to support a container, wherein each of the storage shelves has multiple shelf features for engaging with ports in the container to lock the container with respect to the storage shelf when placed on the storage shelf.

7. The storage system of claim 1, wherein the horizontal motion assembly includes a pneumatic cylinder, a plurality of linear bearings, and an active port base, wherein the active port base is coupled to the base plate, wherein the linear bearings are coupled to the active port base, wherein the pneumatic cylinder is configured to retract with respect to the active port base to define the retracted position and to extend with respect to the active port base to define the extended position.

8. The storage system of claim 1, wherein in the extended position, the port plate is configured to transfer a container when supported on the port plate to an overhead transfer vehicle, wherein in the extended position, the port plate is configured to receive a container from the overhead transfer vehicle for being supported on the port plate.

9. The storage system of claim 1, wherein the storage shelves are configured to form multiple horizontal rows above the horizontal plane of the base plate, wherein there is a lack of a stacker robot between the horizontal rows.

10. The storage system of claim 1, wherein the tool has a plurality of load ports, wherein one of the load ports is vertically aligned with the port plate when the active port assembly is in the extended position.

11. A storage system comprising:
a frame of the storage system located above and coupled to a frame of an assembly of a tool;
a base plate coupled to the frame of the storage system, wherein the base plate is coupled to a rotating mechanism driven by a motor, wherein the base plate is oriented to define a horizontal plane, wherein the base plate is located below the motor;
a plurality of storage shelves coupled to the rotating mechanism for horizontal movement of the storage shelves, wherein the storage shelves move together to one or more positions, wherein one of the storage shelves has a shelf plate;
a bearing plate coupled to the shelf plate;
an active port assembly connected to the frame of the storage system, wherein the active port assembly has a port plate, wherein the port plate is positioned at one of the positions, wherein the active port assembly further includes a horizontal motion assembly defining an extended position of the port plate outside of the frame of the storage system and a retracted position of the port plate inside the frame of the storage system, wherein in the retracted position, the port plate is disposed above the bearing plate and below the shelf plate; and
a transfer hoist assembly located above the frame of the storage system and coupled to the frame of the storage system.

12. The storage system of claim 11, wherein the transfer hoist assembly has a hoist linear drive assembly, a cantilever support, and a hoist frame, wherein the hoist linear drive assembly is coupled to the frame of the storage system, wherein the cantilever support is coupled to the hoist linear drive assembly and to the hoist frame, wherein the hoist frame is configured to move in a horizontal direction with respect to the frame of the storage system to facilitate a transfer of a container to or from the port plate when in the extended position.

13. The storage system of claim 11, further comprising an active port coupled to the active port assembly, wherein the frame of the storage system and the active port together form a wall that partially surrounds the base plate, the rotating mechanism, and the storage shelves, wherein each of the storage shelves has multiple shelf features configured to support a container when placed on top of the storage shelf, wherein the port plate has multiple port features configured to support the container when placed on top of the port plate.

14. The storage system of claim 11, wherein the rotating mechanism includes a plurality of sprockets, a rail, and a chain, wherein the sprockets includes a drive sprocket and an idler sprocket, wherein the rail is coupled to the base plate, wherein the motor is coupled to the drive sprocket, wherein the sprockets are configured to engage the chain, wherein the chain is coupled to the plurality of storage shelves, wherein the motor is configured to operate to rotate the drive sprocket to further move the chain, wherein the chain moves to move the storage shelves with respect to the base plate.

15. The storage system of claim 11, wherein the bearing plate is one of a plurality of bearing plates and the shelf plate is one of a plurality of shelf plates, wherein the rotating mechanism includes a rail and the bearing plates that are supported on top of the rail, wherein the rail is coupled to the base plate, wherein the bearing plates are configured to rotate with respect to the rail, wherein the storage shelves have the shelf plates, wherein a vertical clearance is formed between the shelf plate and the bearing plate for allowing the port plate to partially surround the vertical clearance before transferring a container to the one of the storage shelves or receiving the container from the one of the storage shelves.

16. The storage system of claim 11, wherein the shelf plate is configured to support a container, wherein each of the storage shelves has multiple shelf features for engaging with ports in the container to lock the container with respect to the storage shelf when placed on the storage shelf.

17. The storage system of claim 11, wherein the horizontal motion assembly includes a pneumatic cylinder, a plurality of linear bearings, and an active port base, wherein the active port base is coupled to the base plate, wherein the linear bearings are coupled to the active port base, wherein the pneumatic cylinder is configured to retract with respect to the active port base to define the retracted position and to extend with respect to the active port base to define the extended position.

18. A storage system comprising:
a first frame of the storage system located above and coupled to a frame of an assembly of a tool;

a base plate coupled to the first frame of the storage system, wherein the base plate is coupled to a rotating mechanism driven by a motor, wherein the base plate is oriented to define a horizontal plane, wherein the base plate is located below the motor;

a plurality of storage shelves coupled to the rotating mechanism for horizontal movement of the storage shelves, wherein the storage shelves move together to one or more positions, wherein one of the storage shelves has a shelf plate;

a bearing plate coupled to the shelf plate;

a first active port assembly coupled to the first frame of the storage system, wherein the first active port assembly has a first port plate, wherein the first port plate is positioned at one of the positions, wherein the first active port assembly further includes a first horizontal motion assembly defining an extended position of the first port plate outside of the first frame of the storage system and a retracted position of the first port plate inside the first frame of the storage system, wherein in the retracted position, the first port plate is disposed above the bearing plate and below the shelf plate; and a second frame of the storage system, wherein the second frame is coupled to the first frame and is located above the first frame.

19. The storage system of claim 18, further comprising a second active port assembly coupled to the second frame of the storage system, wherein the second active port assembly further includes a second horizontal motion assembly defining an extended position outside of the second frame of the storage system and a retracted position inside the second frame of the storage system.

20. The storage system of claim 18, further comprising an active port coupled to the active port assembly, wherein the first frame of the storage system and the active port together form a wall that partially surrounds the base plate, the rotating mechanism, and the storage shelves, wherein each of the storage shelves has multiple shelf features configured to support the container when placed on top of the storage shelf, wherein the first port plate has multiple port features configured to support the container when placed on top of the first port plate.

21. The storage system of claim 18, wherein the rotating mechanism includes a plurality of sprockets, a rail, and a chain, wherein the sprockets includes a drive sprocket and an idler sprocket, wherein the rail is coupled to the base plate, wherein the motor is coupled to the drive sprocket, wherein the sprockets are coupled to the chain, wherein the chain is coupled to the plurality of storage shelves, wherein the motor is configured to operate to rotate the drive sprocket to further move the chain, wherein the chain moves to move the storage shelves with respect to the base plate.

22. The storage system of claim 18, wherein the bearing plate is one of a plurality of bearing plates and the shelf plate is one of a plurality of shelf plates, wherein the rotating mechanism includes a rail and the bearing plates that are supported on top of the rail, wherein the rail is coupled to the base plate, wherein the bearing plates are configured to rotate with respect to the rail, wherein the storage shelves have the shelf plates, wherein a vertical clearance is formed between the shelf plate and the bearing plate for allowing the first port plate to partially surround the vertical clearance before transferring a container to the one of the storage shelves or receiving the container from the one of the storage shelves.

23. The storage system of claim 18, wherein the shelf plate is configured to support a container, wherein each of the storage shelves has multiple shelf features for engaging with ports in the container to lock the container with respect to the storage shelf when placed on the storage shelf.

24. The storage system of claim 18, wherein the horizontal motion assembly includes a pneumatic cylinder, a plurality of linear bearings, and an active port base, wherein the active port base is coupled to the base plate, wherein the linear bearings are coupled to the active port base, wherein the pneumatic cylinder is configured to retract with respect to the active port base to define the retracted position and to extend with respect to the active port base to define the extended position.

25. A storage system comprising:

a frame of the storage system located above and coupled to a frame of an assembly of a tool;

a base plate coupled to the frame of the storage system, wherein the base plate is coupled to a rotating mechanism driven by a motor, wherein the base plate is oriented to define a horizontal plane, wherein the base plate is located below the motor;

a plurality of storage shelves coupled to the rotating mechanism for horizontal movement of the storage shelves, wherein the storage shelves move together to one or more positions;

an active port assembly connected to the frame of the storage system, wherein the active port assembly has a port plate, wherein the port plate is positioned at one of the positions, wherein the active port assembly further includes a horizontal motion assembly defining an extended position outside of the frame of the storage system and a retracted position inside the frame of the storage system; and a transfer hoist assembly located above the frame of the storage system and coupled to the frame of the storage system, wherein the transfer hoist assembly has a hoist linear drive assembly, a cantilever support, a hoist frame, a transfer hoist belt, and a gripper, wherein the hoist linear drive assembly is coupled to the frame of the storage system, wherein the cantilever support is coupled to the hoist linear drive assembly and to the hoist frame, wherein the hoist frame is coupled to the transfer hoist belt, wherein the transfer hoist belt is coupled to the gripper, wherein the hoist frame is configured to move in a horizontal direction with respect to the frame of the storage system to facilitate a transfer of a container to or from the port plate when in the extended position, wherein the gripper is configured to extend with respect to the hoist frame via the transfer hoist belt to transfer the container from the port plate when placed on the port plate in the extended position or to the port plate for placement on the port plate in the extended position.

* * * * *